(12) United States Patent
Tian et al.

(10) Patent No.: US 11,592,145 B2
(45) Date of Patent: Feb. 28, 2023

(54) LASER LIGHT SOURCE AND LASER PROJECTION DEVICE

(71) Applicant: HISENSE LASER DISPLAY CO., LTD., Qingdao (CN)

(72) Inventors: Xintuan Tian, Qingdao (CN); Changming Yang, Qingdao (CN); Yun Zhao, Qingdao (CN); Lei Cui, Qingdao (CN); Zhe Xing, Qingdao (CN)

(73) Assignee: HISENSE LASER DISPLAY CO., LTD., Qingdao (CN)

( * ) Notice: Subject to any disclaimer, the term of this patent is extended or adjusted under 35 U.S.C. 154(b) by 773 days.

(21) Appl. No.: 16/569,628

(22) Filed: Sep. 12, 2019

(65) Prior Publication Data

US 2020/0224826 A1 Jul. 16, 2020

Related U.S. Application Data

(63) Continuation of application No. PCT/CN2019/103365, filed on Aug. 29, 2019.

(30) Foreign Application Priority Data

Jan. 10, 2019 (CN) .......................... 201910023575.8
Feb. 20, 2019 (CN) .......................... 201910124893.3
(Continued)

(51) Int. Cl.
*H01S 5/042* (2006.01)
*F21K 9/20* (2016.01)
(Continued)

(52) U.S. Cl.
CPC .................. *F21K 9/20* (2016.08); *F21K 9/90* (2013.01); *G03B 21/204* (2013.01);
(Continued)

(58) Field of Classification Search
CPC .... H01S 5/042; H01S 5/0425; H01S 5/04256; H01S 3/038; H01S 3/0385
See application file for complete search history.

(56) References Cited

U.S. PATENT DOCUMENTS 5,539,767 A * 7/1996 Nakanishi ........... H01S 5/02257
257/E33.059
5,959,837 A 9/1999 Yu
(Continued)

FOREIGN PATENT DOCUMENTS

CN 1403777 A 3/2003
CN 101295848 A 10/2008
(Continued)

OTHER PUBLICATIONS

First Office Action of the priority application CN201910023575.8.
(Continued)

*Primary Examiner* — Jeremy C Norris
(74) *Attorney, Agent, or Firm* — J.C. Patents

(57) ABSTRACT

Embodiments of the present application provide a laser light source and a laser projection device. The laser light source includes a laser assembly, where the laser assembly includes a laser and a circuit board, the laser includes a substrate and a light emitting chip arranged on the substrate, a lateral surface of the substrate is provided with a plurality of pins extending outwards therefrom, the circuit board is arranged on a side where the pins extend, and the circuit board is electrically connected to the pins. The laser light source of the present application features simple assembling and disassembling, reliable performance and relatively low cost.

16 Claims, 29 Drawing Sheets

(30) Foreign Application Priority Data

Feb. 20, 2019 (CN) .................. 201910125848.X
Feb. 20, 2019 (CN) .................. 201910126215.0

(51) Int. Cl.
| | | |
|---|---|---|
| *G03B 21/20* | (2006.01) | |
| *F21K 9/90* | (2016.01) | |
| *H01S 5/02216* | (2021.01) | |
| *F21Y 115/30* | (2016.01) | |
| *H05K 1/18* | (2006.01) | |

(52) U.S. Cl.
CPC ...... *G03B 21/2033* (2013.01); *H01S 5/02216* (2013.01); *H01S 5/042* (2013.01); *F21Y 2115/30* (2016.08); *H05K 1/183* (2013.01)

(56) References Cited

U.S. PATENT DOCUMENTS

| | | | |
|---|---|---|---|
| 6,191,946 | B1 | 2/2001 | Yu |
| 9,357,676 | B2 | 5/2016 | Yamaguchi |
| 2003/0141041 | A1 | 7/2003 | Chen |
| 2004/0178960 | A1* | 9/2004 | Sun .................. H01Q 1/243 |
| | | | 343/700 MS |
| 2005/0140937 | A1 | 6/2005 | Kumai |
| 2005/0141198 | A1 | 6/2005 | Lee |
| 2005/0231913 | A1 | 10/2005 | Malone |
| 2006/0011329 | A1 | 1/2006 | Wang |
| 2006/0185952 | A1 | 8/2006 | Kojima |
| 2007/0039332 | A1 | 2/2007 | Lee |
| 2009/0025909 | A1 | 1/2009 | Huang |
| 2009/0052483 | A1 | 2/2009 | Lin |
| 2009/0151899 | A1 | 6/2009 | Chang |
| 2010/0007861 | A1 | 1/2010 | Takezawa |
| 2010/0051254 | A1 | 3/2010 | Ipposhi |
| 2011/0096543 | A1 | 4/2011 | Yabe |
| 2011/0179806 | A1 | 7/2011 | Ipposhi |
| 2011/0194578 | A1 | 8/2011 | Hirose |
| 2011/0197596 | A1 | 8/2011 | Cheng |
| 2011/0225983 | A1 | 9/2011 | Kojima |
| 2012/0287954 | A1 | 11/2012 | Saruwatari |
| 2012/0312508 | A1 | 12/2012 | Shen |
| 2013/0070206 | A1 | 3/2013 | Kazama |
| 2013/0279115 | A1 | 10/2013 | Blumenthal |
| 2015/0355533 | A1 | 12/2015 | Masuda |
| 2016/0025642 | A1 | 1/2016 | Choulet |
| 2016/0048179 | A1 | 2/2016 | Watanabe |
| 2016/0254642 | A1 | 9/2016 | Takigawa |
| 2016/0254643 | A1 | 9/2016 | Takigawa |
| 2016/0298909 | A1 | 10/2016 | Yeh |
| 2019/0096536 | A1 | 3/2019 | Arafat |
| 2019/0186717 | A1 | 6/2019 | Barrett |

FOREIGN PATENT DOCUMENTS

| | | |
|---|---|---|
| CN | 101855902 A | 10/2010 |
| CN | 202333437 U | 7/2012 |
| CN | 202506964 U | 10/2012 |
| CN | 202759153 U | 2/2013 |
| CN | 103187683 A | 7/2013 |
| CN | 103486889 A | 1/2014 |
| CN | 103904552 A | 7/2014 |
| CN | 104009028 A | 8/2014 |
| CN | 104329871 A | 2/2015 |
| CN | 104654669 A | 5/2015 |
| CN | 104808425 A | 7/2015 |
| CN | 204459257 U | 7/2015 |
| CN | 104954709 A | 9/2015 |
| CN | 105186288 A | 12/2015 |
| CN | 205353543 U | 6/2016 |
| CN | 205385193 U | 7/2016 |
| CN | 105846309 A | 8/2016 |
| CN | 205811265 U | 12/2016 |
| CN | 106532413 A | 3/2017 |
| CN | 106595359 A | 4/2017 |
| CN | 206270635 U | 6/2017 |
| CN | 107204562 A | 9/2017 |
| CN | 107247312 A | 10/2017 |
| CN | 107300825 A | 10/2017 |
| CN | 107656413 A | 2/2018 |
| CN | 206962242 U | 2/2018 |
| CN | 206962650 U | 2/2018 |
| CN | 207473283 U | 6/2018 |
| CN | 108321666 A | 7/2018 |
| CN | 105932539 B | 10/2018 |
| CN | 108616029 A | 10/2018 |
| CN | 108627936 A | 10/2018 |
| CN | 208028439 U | 10/2018 |
| CN | 108919596 A | 11/2018 |
| CN | 109068539 A | 12/2018 |
| CN | 208188561 U | 12/2018 |
| CN | 208227565 U | 12/2018 |
| DE | 20300300 U1 | 3/2003 |
| DE | 202005017349 U1 | 1/2006 |
| DE | 202007008221 U1 | 10/2007 |
| DE | 202011050768 U1 | 1/2012 |
| FR | 2667273 A1 | 4/1992 |
| JP | H0786473 A | 3/1993 |
| JP | H0763487 A | 3/1995 |
| JP | H10244707 A | 9/1998 |
| JP | 2002081874 A | 3/2002 |
| JP | 2005322757 A | 11/2005 |
| JP | 2004156232 A | 4/2006 |
| JP | 2007183396 A | 7/2007 |
| JP | 2010106951 A | 5/2010 |
| JP | 2011249714 A | 12/2011 |
| JP | 6688936 B2 | 4/2020 |
| KR | 20170022754 A | 3/2017 |
| TW | M249104 U | 11/2004 |
| TW | 201042227 A | 12/2010 |
| WO | WO2006114587 A1 | 11/2006 |
| WO | WO2010114841 A1 | 10/2010 |
| WO | WO2010144841 A1 | 12/2010 |
| WO | WO2015072737 A1 | 5/2015 |

OTHER PUBLICATIONS

First Office Action of the priority application CN201910124893.3.
First Office Action of the priority application CN201910125848.X.
First Office Action of the priority application CN201910126215.0.
First Office Action of the corresponding application U.S. Appl. No. 16/702,438.
The Chinese International Search Report of corresponding International application No. PCT/CN2019/103365, dated Dec. 10, 2019.
Extended European Search Report of the counterpart application EP19765963.4.
The partial supplementary European search report of EPO application No. 19765963.4 (1).
The first Office Action of the counterpart application U.S. Appl. No. 16/702,438.
The International Search Report of corresponding International Application PCT/CN2019/105735, dated Nov. 29, 2019.
Non-final Office Action of the corresponding application U.S. Appl. No. 16/702,438.
Notice of Allowance of the priority application CN201910023575.8.

* cited by examiner

LASER LIGHT SOURCE AND LASER PROJECTION DEVICE

CROSS-REFERENCE TO RELATED APPLICATIONS

This application is a continuation of International Application No. PCT/CN2019/103365 filed on Aug. 29, 2019, which claims priority to Chinese Patent Application No. 201910126215.0, filed on Feb. 20, 2019, Chinese Patent Application No. 201910125848.X, filed on Feb. 20, 2019, Chinese Patent Application No. 201910023575.8, filed on Jan. 10, 2019, and Chinese Patent Application No. 201910124893.3, filed on Feb. 20, 2019. All of the aforementioned patent applications are hereby incorporated by reference in their entireties.

TECHNICAL FIELD

The present application relates to the field of laser projection display technology and, in particular, to a laser light source and a laser projection device.

BACKGROUND

With the continuous advancement of technology, new projection devices such as laser projection devices are appearing more and more in our work and life.

In an exsiting assembly method of a laser light source using a thin laser, the thin laser is characterized by having four pins on each of its left and right sides, and accordingly, a circuit board is arranged on each of the left and right sides of the laser, forming a "butterfly" package in which two circuit boards are vertically connected to both sides of the laser. However, when such an exsiting laser light source is disassembled, the two circuit boards have to be separated from the pins on both sides of the laser, and then the circuit board is removed from a housing, so that the disassembly of the laser and the housing is completed, and the disassembly process is complicated.

SUMMARY

Some embodiments of the present application provide a laser light source, including a laser assembly, where the laser assembly includes a laser and a circuit board, the laser includes a substrate and a light emitting chip arranged on the substrate. A lateral surface of the substrate is provided with a plurality of pins extending outwards therefrom. The circuit board is arranged on the side where the pins extend. In addition, the circuit board is electrically connected to the pins.

Some embodiments of the present application provide a laser projection device including the laser light source as described above.

BRIEF DESCRIPTION OF THE DRAWINGS

In order to more clearly illustrate the embodiments of the present application or the technical solutions in the prior art, the drawings required in describing the embodiments or the prior art will be briefly introduced below. Apparently, the drawings described in the following are for some embodiments of the present application, and other drawings can be obtained by those skilled in the art from these drawings without paying any creative labor.

Figure 1:
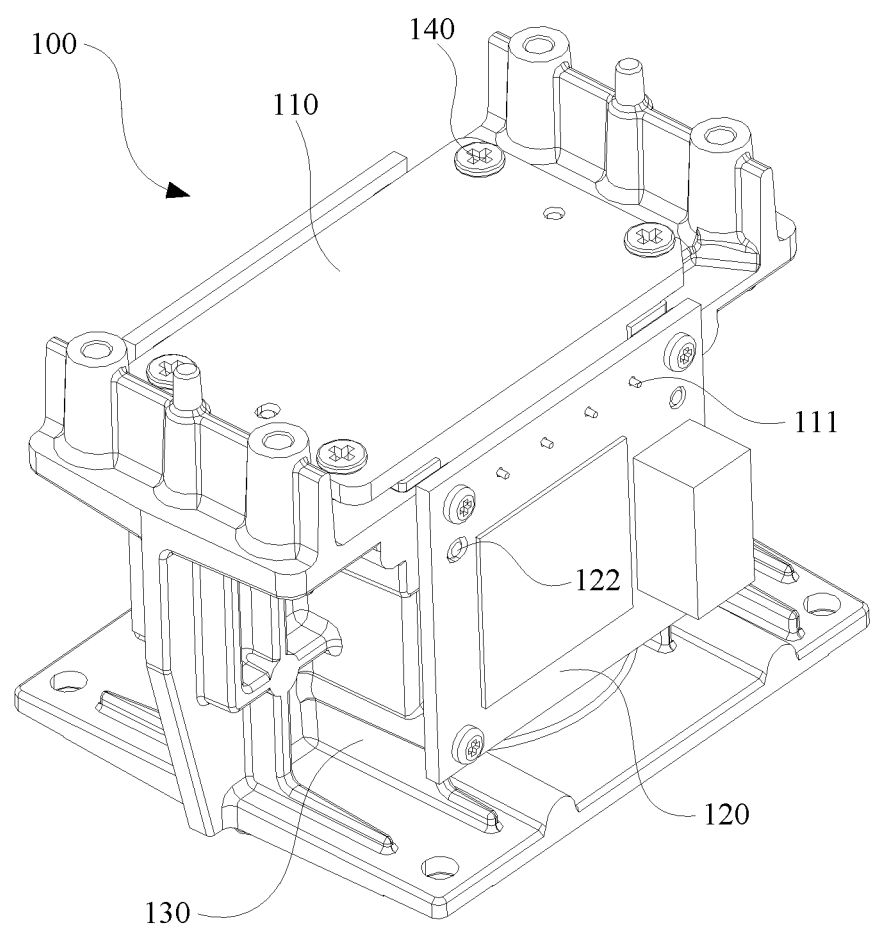
FIG. 1 is a schematic assembled view of a laser light source in the related art.

DESCRIPTION OF THE REFERENCE NUMERALS 100, 200, 700, 9, 901—laser light source; 110, 211, 710, 1, 91—laser; 111, 2111—pin; 120, 212—circuit board; 121—a small hole; 122—positioning hole; 130, 220, 730, 2—housing; 131—threaded hole; 132—positioning stud; 133—threaded hole; 140, 143—screw; 210—laser assembly; 2112—light emitting chip; 2113, 102—substrate; 2121—receiving region; 221—first bearing part; 222—second bearing part; 230—protection cover; 240—fastener; 300, 740—lens; 400—light guide; 600, 800, 900—laser projection device; 711—light emitting region; 7111—green light emitting region; 7112—blue light emitting region; 7113—red light emitting region; 720—light combination mirror assembly; 721—mirror; 7211—reflection mirror; 7212—first light combination mirror; 7213—second light combination mirror; 731—receiving cavity; 732—opening; 750—light stick; 101—base; 103—compound-eye lens; 201—laser mounting port; 202—second guiding slop; 203—pressure corner; 3—sealing element; 301—side part; 302—top part; 303—first guiding slop; 304—reinforcement coner; 305—first pair of sidewalls; 306—second pair of sidewalls; 902—light modulation apparatus; 904—projection medium; 92—heat sink; 10—lighting system; 11—first heat conduction block; 12—first layer of thermotube; 13—second heat conduction block; 14—second layer of thermotube; 15—third heat conduction block; 16—fin module; 17—fan bracket; 18—fan; 500, 903, 19—lens assembly system; 112—first groove; 134—second groove; 135—third groove; 151—fourth groove; 123—bend part; 124—hot end; 125—cold end.

DESCRIPTION OF EMBODIMENTS

In order to make objectives, technical solutions and advantages of embodiments of the present application clearer, the technical solutions in the embodiments of the present application will be described hereunder clearly and comprehensively with reference to accompanying drawings. Obviously, the described embodiments are only a part of embodiments of the present application, rather than all of them. Based on the embodiments of the present application, all other embodiments obtained by persons of ordinary skill in the art without making any creative effort shall fall within the protection scope of the present application.

Figure 2:
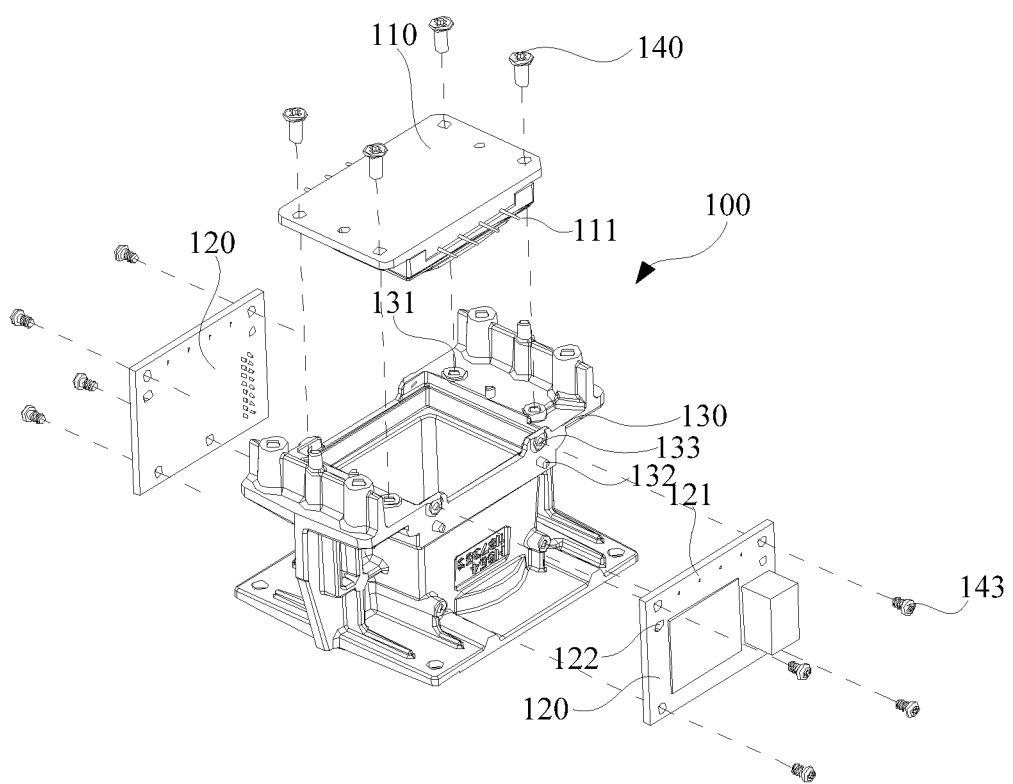
FIG. 2 is a schematic exploded view of the laser light source in FIG. 1.

FIG. 1 is a schematic assembled view of a laser light source in related art. FIG. 2 is a schematic exploded view of the laser light source in FIG. 1. As shown in FIG. 1 and FIG. 2, in an assembly method of a laser light source 100 using a thin laser, a circuit board 120 is arranged on each of the left and right sides of the laser 110, forming a "butterfly" package in which two circuit boards 120 are vertically connected to both sides of the laser 110. Specifically, the laser 110 is first fixed to a housing 130 by screws 140. Then, the two circuit boards 120 are separately arranged on both sides of the laser 110 and fixed onto the housing 130 by screws 140. Four small holes 121 are provided on the circuit boards 120 at locations corresponding to the four pins 111 of the laser 110. When the laser 110 is connected to the circuit board 120, the four pins 111 may pass through the four small holes 121 and be soldered, thus realizing the electrical connection between the laser 110 and the circuit board 120.

Specifically, the housing 130 is provided with threaded holes 131 for fixing the laser 110. The laser 110 is first fixed to the housing 130 by screws 140, and then the two circuit boards 120 are separately fixed on both sides of the housing 130. The circuit boards 120 and the laser 110 are perpendicular to each other. The housing 130 is also provided with screw holes 133 for mounting the circuit boards 120. The two circuit boards 120 are fixed to the housing 130 by screws 143. In addition, positioning studs 132 are also provided on both sides of the housing 130. Correspondingly, the circuit board 120 is provided with positioning holes 122, which fit with the positioning studs 132 to position the circuit board 120, protecting the pins 111 of the laser 110 from disturbance of external force that may occur during operations such as assembling and soldering.

As described above, according to the above assembly method of the laser light source, two circuit boards 120 need to be vertically connected to both sides of the laser 110 during assembling, the laser 110 and the two circuit boards 120 are respectively fixed to the housing 130 by screws 140, the four pins 111 on each of both sides of the laser 110 separately pass through the four small holes 121 on each of the two circuit boards 120 and are soldered to the circuit board 120. When disassembling, the screws 140 have to be first removed from the laser 110 and the two circuit boards 120, then the laser 110 has to be separated from the circuit boards 120, otherwise it will be difficult to remove the laser 110 from the housing 130. In the process of disassembling the laser 110 and the circuit boards 120, the pins 111 on the laser 110 are highly susceptible to be damaged.

It can be seen that, in the above assembly method of the laser light source, it is difficult to assemble and disassemble the laser, the circuit boards and the housing, and damage is likely to happen to the pins of the laser.

Accordingly, the present application provides a laser light source and a laser projection device that allows for a simplified assembly method for the laser, the circuit boards and the housing to facilitate the assembling and disassembling procedures.

Figure 3A:
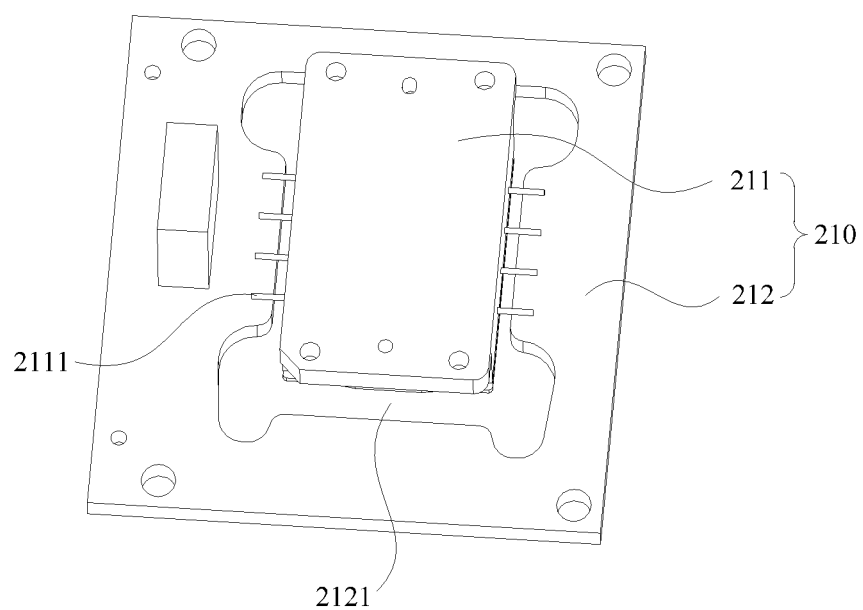
FIG. 3A is a schematic structural view of a laser assembly according to Embodiment 1 of the present application.
Figure 3B:
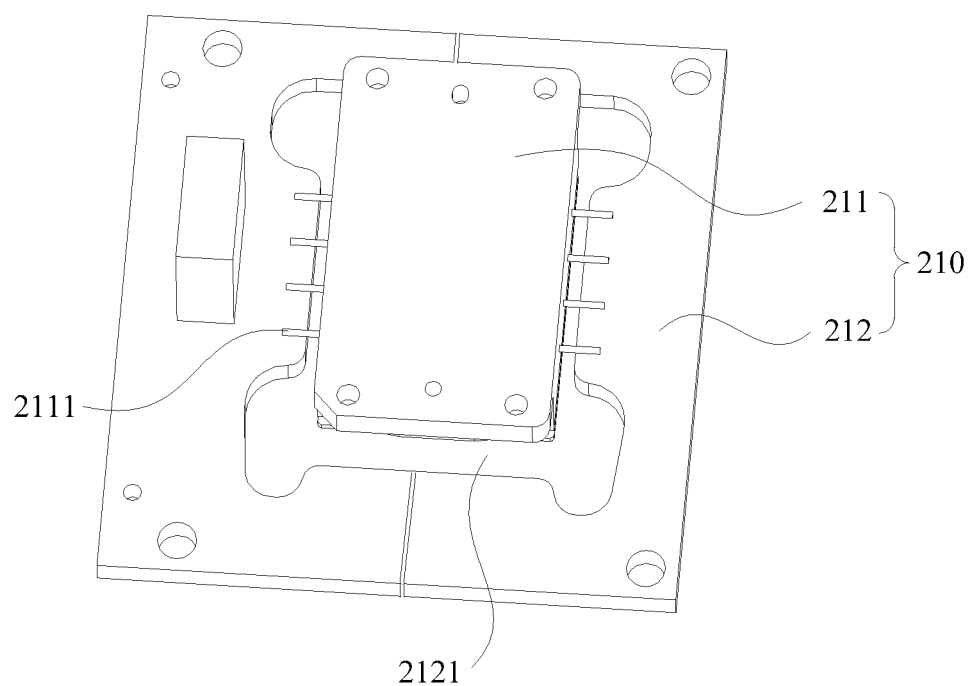
FIG. 3B is a schematic structural view of a laser assembly according to Embodiment 1 of the present application.
Figure 4:
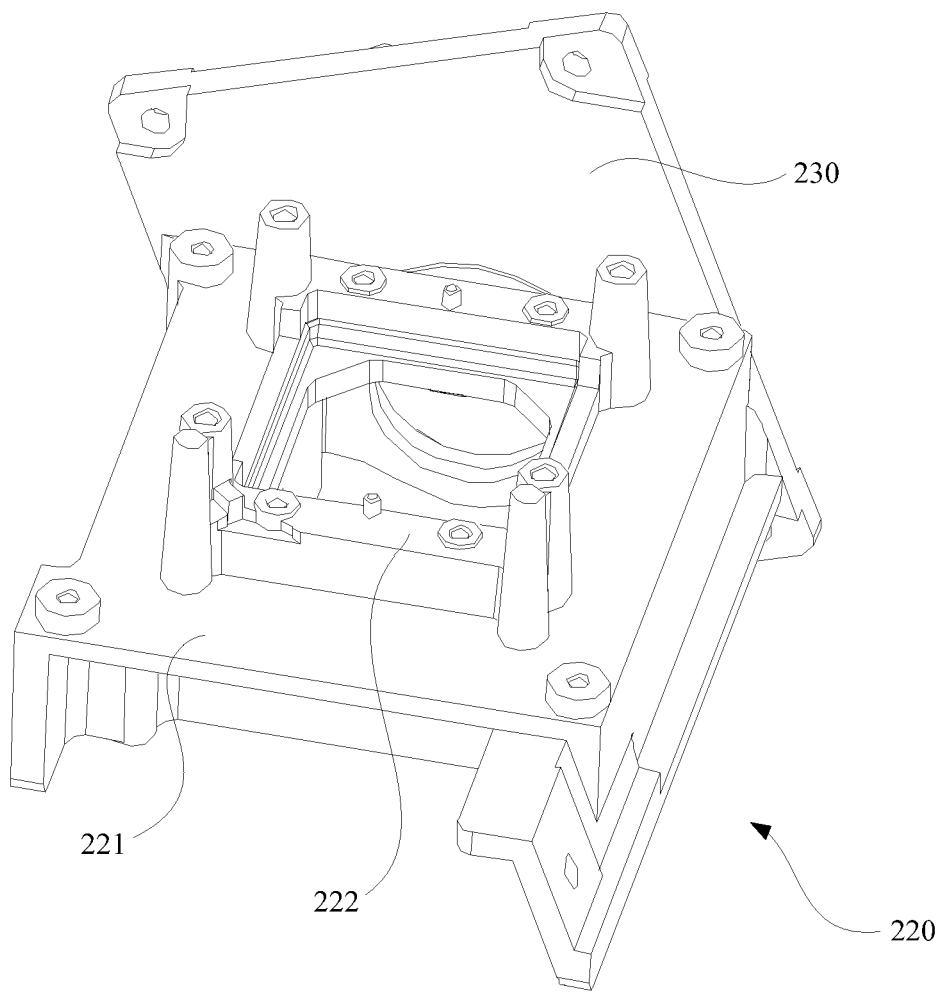
FIG. 4 is a schematic structural view of a housing according to Embodiment 1 of the present application.
Figure 5:
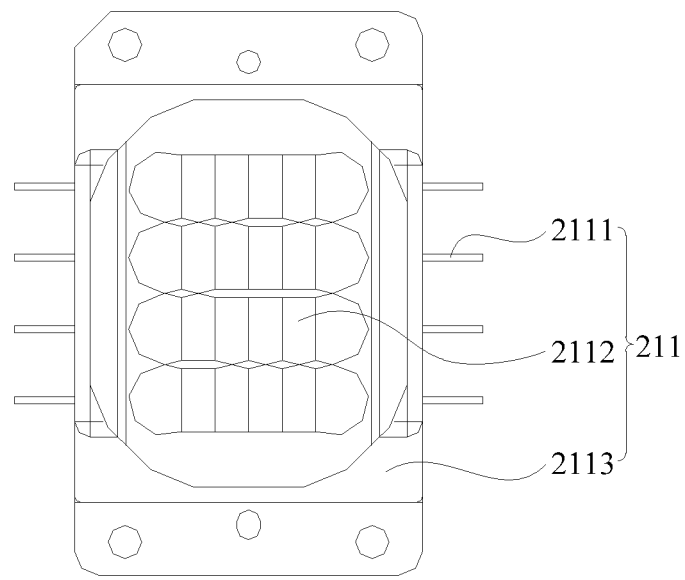
FIG. 5 is a front view of a laser according to Embodiment 1 of the present application.
Figure 6:
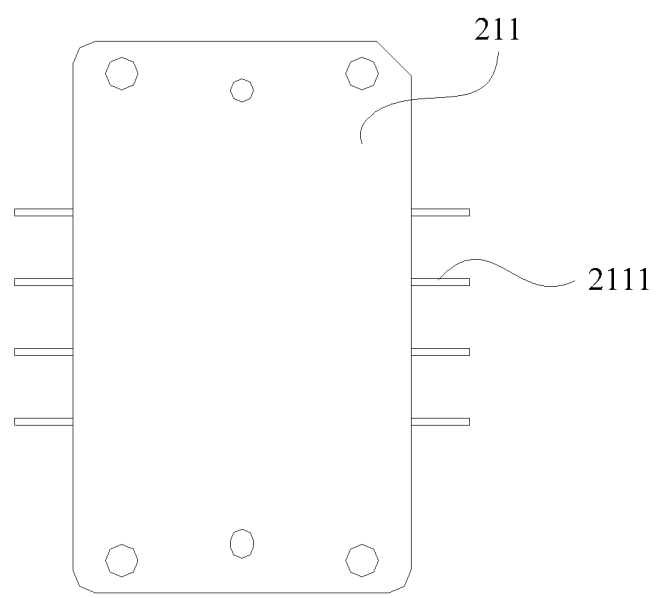
FIG. 6 is a rear view of the laser according to Embodiment 1 of the present application.

FIG. 3A and FIG. 3B are schematic structural views of a laser assembly according to Embodiment 1 of the present application. FIG. 4 is a schematic structural view of a housing according to Embodiment 1 of the present application. FIG. 5 is a front view of a laser according to Embodiment 1 of the present application. FIG. 6 is the rear view of a laser according to Embodiment 1 of the present application. As shown in FIG. 3A, FIG. 3B, and FIG. 4 to FIG. 6, this embodiment provides a laser light source 200, including a laser assembly 210 that, in turn, includes a laser 211 and a circuit board 212. The laser 211 includes a substrate 2113 and a light emitting chip 2112 arranged on the substrate 2113. A light emitting surface of the laser 211 is parallel to a plane in which the substrate 2113 is located. Lateral surfaces of the substrate 2113 are provided with a plurality of pins 2111 that extend outward from the substrate. The circuit board 212 is arranged on the side to which the pins 2111 extend, and is parallel to the plane in which the substrate 2113 is located, the circuit board 212 being electrically connected to the pins 2111.

The laser light source 200 provided in this embodiment includes a laser assembly 210 which, in turn, includes a laser 211 and the circuit board 212. Specifically, as shown in FIG. 5 and FIG. 6, the laser 211 may be a thin laser. The laser 211 is in the form of a thin plate as a whole. The laser 211 includes a substrate 2113, on which a light emitting chip 2112 may be arranged to function as a light source. In a possible implementation, four rows of light emitting chips 2112 may be arranged on the substrate 2113 of the laser 211. The four rows of light emitting chips 2112 may be in the same color to emit laser light of the same color, or may be in different colors to emit lasers of different colors, which may be arranged as practically needed, and will not be limited in this embodiment.

Specifically, the laser 211 is provided with pins 2111 for transmitting a signal to cause the light emitting chips 2112 to emit light. Since the substrate 2113 of the laser 211 is provided with the light emitting chips 2112 that emit the laser light, it serves as the light emitting surface of the laser 211. A back surface of the laser 211 faces away from the light emitting chip 2112. The pins 2111 are arranged on the lateral surfaces of the laser 211, with one end of each of the pins 2111 being fixed on a sidewall of the substrate 2113 of the laser 211, and another end extending towards the outside of the substrate 2113. The pins 2111 are used for connecting with the circuit board 212 to realize current conduction between the laser 211 and circuit board 212, thus making the light emitting chips 2112 on the laser 211 emit light.

As shown in FIG. 3A and FIG. 3B, the circuit board 212 in this embodiment can be arranged surrounding the sidewalls of the laser 211. The circuit board 212 and the pins 2111 of the laser 211 are electrically connected to realize current conduction between the laser 211 and the circuit board 212. The laser 211 and circuit board 212 together are called laser assembly 210. The laser assembly 210 may be fixed to the housing 220 through a fixed connection between the circuit board 212 and the housing 220. As shown in FIG. 4, the circuit board 212 is arranged outside the laser 211, one surface of the laser assembly 210, which includes the circuit board 212 and the laser 211, is the light emitting surface of the light emitting chips 2112 on the laser 211, and the other surface is the back surface of the laser 211. When the laser assembly 210 is fixed to the housing 220, the light emitting surface of the laser 211 faces the inner side of the housing 220, and the back surface of the laser 211 faces the outer side of the housing 220, so that the light source of the laser 211 may project its light onto the lens assembly system of the laser projection device.

In contrast with the related art assembly method of laser light source, in which a laser need to be provided with two circuit boards on both sides, the laser and the two circuit boards need to be separately fixed on a housing and pins on both sides of the laser need to be separately connected with the two circuit boards, this embodiment provides a laser 211 and a circuit board 212 that may be combined into a laser assembly 210. Connection between the laser 211, the circuit board 212 and a housing 220 may be realized by simply fixing the laser assembly 210 as a whole to the housing 220. This method facilitates the assembly between the laser 211, the circuit board 212 and the housing 220. When the related art laser light source is to be disassembled, both the laser and the circuit boards have to be separated from the housing, and the laser also has to be separated from the circuit board, to disassemble the laser. But this embodiment allows for simply removing the laser assembly 210 from the housing 220, without any need to further separate the laser 211 from the circuit board 212, hence providing a simplified and faster disassembly method, without threatening damage to the pins 2111 during the process. In addition, due to constraints of the dimension of the circuit boards, which are vertically connected on both sides of the laser of the related art laser light source, the optical path along the radiation direction of the light source is longer than desired. In contrast, the circuit board 212 of the embodiment is arranged outside the laser 211, and a first surface of the circuit board 212 is almost in the same plane as the laser 211, allowing for a shorter optical path along the radiation direction of the light source, so that lens in the optical path can be arranged closer to the light emitting surface of the laser 211. Compared with the related art laser light source assembly method, the length of the optical path can be shortened by 15-40 mm.

In addition, since this embodiment allows for providing only one circuit board 212 outside the laser 211, the structure of the laser light source 200 of this embodiment is simpler than that of the related art where two circuit boards 212 need to be arranged on both sides of the laser 211, and at a lower cost.

Further, in a specific embodiment, the circuit board 212 has oppositely arranged first and second surfaces, and the pins 2111 are all soldered to the first surface of the circuit board 212. As shown in FIG. 3A and FIG. 3B, the circuit board 212 includes a first surface and a second surface, which are oppositely arranged. When the laser 211 and the circuit board 212 are connected, the pins 2111 protruding from the sidewalls of the substrate 2113 of the laser 211 may overlap, and thus be soldered to the first surface of the circuit board 212, realizing an electrical connection between the laser 211 and the circuit board 212. Moreover, since the pins 2111 protrude from the sidewalls of the substrate 2113 and are soldered on the first surface of the circuit board 212, the laser 211 and the circuit board 212 may be positioned almost in the same plane, enabling a simpler structure for the laser assembly 210 including the laser 211 and the circuit board.

In one embodiment, as shown in FIG. 3B, there may be two circuit boards 212 located respectively on two sides of the laser 211. The two circuit boards 212 respectively correspond to the pins 2111 on two sides of the substrate 2113 of the laser 211. The pins 2111 on the two sides of the substrate 2113 are individually soldered on first surfaces of the two circuit boards 212, where the first surfaces of the two circuit boards 212 are located in the same horizontal plane pins. In one embodiment, as shown in FIG. 3A, there may be one circuit board 212, on which a receiving region 2121 may be provided for receiving the laser 211. The laser 211 may then be arranged in the receiving region 2121, and the light emitting direction of the laser 211 is along an axial direction of the receiving region 2121, wherein the axial direction of the receiving region is a direction perpendicular to the first surface of the circuit board 212. As shown in FIG. 3A and FIG. 3B, a central portion of the circuit board 212 is provided with a receiving region 2121 shaped and dimensioned to match the laser 211. The laser 211 is located in the receiving region 2121, and the pins 2111 of the laser 211 extend onto the first surface of circuit board 212 and are soldered to the circuit board 212. Since the light emitting surface of the laser 211, on which the light emitting chips 2112 are provided, is arranged in parallel with the first surface of the circuit board 212, the light emitting direction of the laser 211 is parallel to the axial direction of the receiving region 2121, specifically, the light emitting direction of the laser 211 may face the relative inner side of the housing 220.

Further, in order to make the connection procedure between the laser 211 and the circuit board 212 smooth to avoid damage to the pins 2111 during the connection, a spacing may be arranged between a holewall of the receiving region 2121 and the laser 211. When the laser 211 is placed into the receiving region 2121 of the circuit board 212 to assemble the two into the laser assembly 210, if there is no spacing between the laser 211 and the receiving region 2121, the outer wall of the laser 211 will be in direct contact with the receiving region 2121. Due to friction, some force will have to be applied to snap the laser 211 into the receiving region 2121, which may bend the pins 2111 on the sidewall of the laser 211 due to excessive force, damaging the pins 2111 or even the electrical current failing to pass between the laser 211 and the circuit board 212.

In addition, excessive spacing is also undesirable between the hole wall of the receiving region 2121 and the laser 211 because the pins 2111 will also be easily bent due to the excessive spacing, and the sections of the pins 2111 overlapping the first surface of the circuit board 212 may be too short, resulting in difficulties in soldering the pins 2111 to the circuit board 212, or weak solder junctions between the pins 2111 and the circuit board 212.

Specifically, the receiving region 2121 may be a through hole or an open slot formed in the circuit board 212. As shown in FIG. 3A and FIG. 3B, a through hole or an open slot may be formed in the circuit board 212 to serve as a receiving region 2121. The through hole or the open slot may be shaped to match the profile of the laser 211, so that the laser 211 may be accommodated therein, with the pins 2111 on both sides of the laser 211 overlapping the first surface of the circuit board 212.

Further, in a specific embodiment, the pins 2111 and the circuit board 212 may be located in the same plane. As shown in FIG. 3A and FIG. 3B, the laser 211 and the circuit board 212 in this embodiment may be assembled into a laser assembly 210. In a specific structure of the laser assembly 210, the circuit board 212 may be arranged outside the laser 211. To facilitate the connection between the laser 211 and the circuit board 212, they may be located in approximately the same horizontal plane, so that the pins 2111 on both sides of the laser 211 may be in the same plane as the first surface of the circuit board 212, which is more convenient for realizing the electrical connection between the pins 2111 and the circuit board 212. Meanwhile, the structural space occupied by the laser assembly 210 made of the laser 211 and the circuit board 212 can be further reduced, so that the structure of the laser assembly 210 is simpler and more liable to attach to and remove from the housing 220.

The ends of the pins 2111 may be attached to the first surface of the circuit board 212 and be soldered thereon. As shown in FIG. 3A and FIG. 3B, in the laser assembly 210, the laser 211 inside the circuit board 212 is located essentially in the same plane as the circuit board 212. Specifically, the pins 2111, which are arranged on the sidewalls of the substrate 2113 of the laser 211 and extend outwards, can be attached and soldered directly to the first surface of the circuit board 212, so that the electrical current passes between the laser 211 and the circuit board 212. That is, the laser 211 and the circuit board 212 may be relative positioned and fixed first, then the pins 2111 of the laser 211 may be attached to the first surface of the circuit board 212, and the pins 2111 of the laser 211 may be soldered to the circuit board 212, so that the two may form the laser assembly 210, and then the laser assembly 210 is mounted to the housing 220.

There may be a plurality of pins 2111 of the laser 211, which are respectively arranged on opposite sides of the substrate 2113. As shown in FIG. 5 or FIG. 6, a plurality of, e.g., eight, pins 2111 may be arranged on the sidewalls of the substrate 2113 of the laser 211, and the plurality of pins 2111 are respectively located on opposite sides of the substrate 2113. When the laser 211 and the circuit board 212 are connected, the main body of the laser 211 is located in the receiving region 2121 of the circuit board 212, and the pins 2111 on both sides of the substrate 2113 overlap the first surfaces of the opposite sides of the circuit board 212, with each pin 2111 being soldered to the first surface of circuit board 212. In a specific implementation, each of the left and right sides of the substrate 2113 includes four pins 2111, and the pins 2111 on two sides are symmetrically arranged, with the pins 2111 on each side overlapping the first surface of the circuit board 212 on the corresponding side. The electrical current can pass between all the pins 2111 and the circuit board 212 by a way of soldering.

Figure 7:
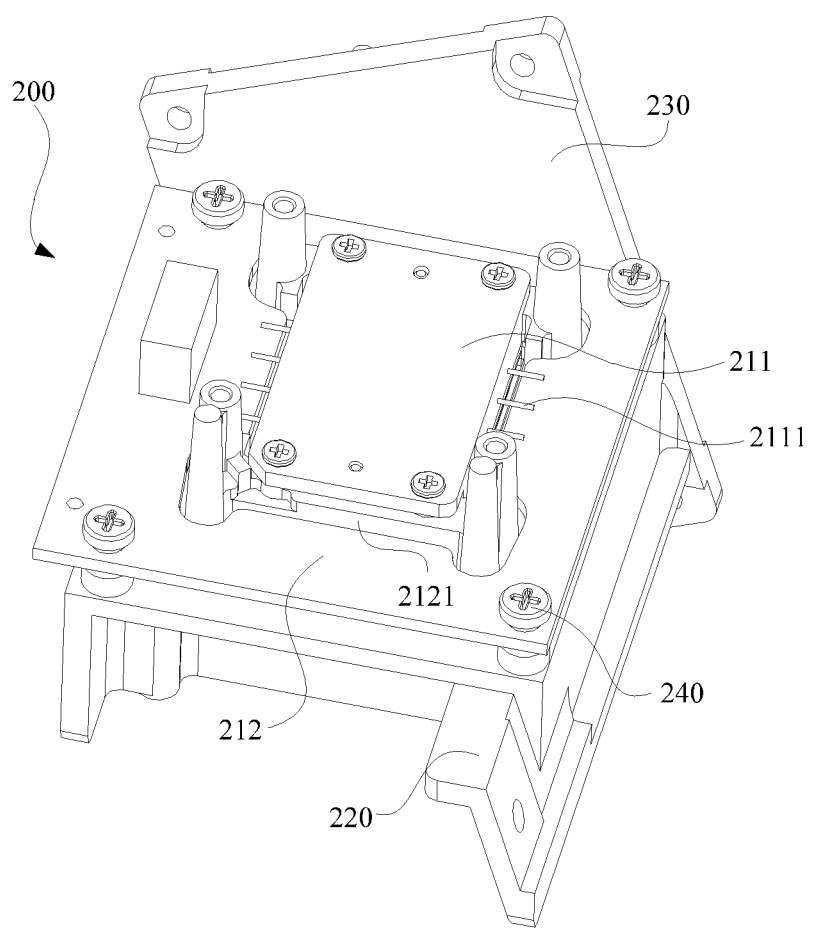
FIG. 7 is a schematic assembled view of a laser assembly and a housing according to Embodiment 1 of the present application.

In a specific embodiment, the laser light source 200 also includes a housing 220, on which the laser 211 may be arranged. FIG. 7 is a schematic assembled view of a laser assembly and a housing according to Embodiment 1 of the present application. As shown in FIG. 7, in order to more reliably fix the circuit board 212 and the laser 211 to the housing 220, the laser assembly 210 can be fixed to the housing 220 via not only the circuit board 212, but also the laser 211. Since both the circuit board 212 and the laser 211 are securely connected to the housing 220, a stronger connection is created between the laser assembly 210 and the housing 220. In addition, the laser 211 may also be more accurately positioned on the housing 220, thereby improving the precision for the optical path propagating from the light emitting chip 2112 of the laser 211.

Specifically, the housing 220 may include a first bearing part 221 for bearing the circuit board 212, and a second bearing part 222 for bearing the laser 211. As shown in FIG. 4, the housing 220 is provided with bearing parts for bearing the laser assembly 210. Since the laser assembly 210 including a laser 211 and a circuit board 212 arranged surrounding the laser 211 and the laser 211 has a light emitting surface provided with light emitting chips 2112, and the light emitting surface of the laser 211 is used to create an optical path of the light source. Thus, the housing 220, which bears the laser assembly 210, is adapted to the structural form of the laser assembly 210 and the functions of the laser 211 and the circuit board 212 in that the bearing parts on the housing 220 may include a first bearing part 221 and a second bearing part 222, where the circuit board 212 is arranged on the first bearing part 221, and the laser 211 is arranged on the second bearing part 222.

The first bearing part 221 may be in a planar structure corresponding to the frame-type planar structure of the circuit board 212, and the circuit board 212 is located on the surface of the first bearing part 221. The laser 211 is located in the middle of the circuit board 212, thus the second bearing part 222 bearing the laser 211 is located in the middle of the first bearing part 221, that is, the first bearing part 221 surrounds the periphery of the second bearing part 222. Moreover, since the light emitting surface of the laser 211 needs to propagate the optical path of the light source, the portion of the second bearing part 222 corresponding to the light emitting surface of the laser 211 should allow laser light to pass through. Specifically, the second bearing part 222 may be provided with through holes that are shaped to match the light emitting surface of the laser 211 to allow the laser light to pass through. Alternatively, the portion of the second bearing part 222 corresponding to the light emitting surface of the laser 211 may also be provided as a transparent element capable of allowing the laser light to pass through without altering the propagation path of the lasers.

For fixing the laser assembly 210 to the housing 220, the laser 211 and/or the circuit board 212 may be connected to the housing 220 by fasteners 240. As described above, the fixing of the laser assembly 210 as a whole to the housing 220 may be achieved by fixing the circuit board 212 to the housing 220. Alternatively, both the circuit board 212 and laser 211 are fixed to the housing 220 to provide a more reliable connection with the housing 220 while providing a more accurate positioning for the laser 211.

Specifically, the circuit board 212 may be connected to the housing 220 by fasteners 240. As shown in FIG. 3A, FIG. 3B, FIG. 4 and FIG. 7, in a specific implementation, the circuit board 212 may be securely connected to the housing 220 by screws. The first bearing part 221 of the housing 220 may be provided with threaded holes, and connection holes are arranged at corresponding locations on the circuit board 212. After being connected together, the laser 211 and the circuit board 212 form the laser assembly 210, and connection holes on the circuit board 212 correspond to the screw holes on the housing 220 one by one. Screws are arranged in the connection holes and threaded holes, and the laser assembly 210 is fixed to the housing 220 by the connection holes, the threaded holes and the screws.

The laser 211 may alternatively be connected to the housing 220 by fasteners 240. As shown in FIG. 3A, FIG. 3B, FIG. 4 and FIG. 7, in a specific implementation, a laser 211 may be securely connected to the housing 220 by screws, a second bearing part 222 of the housing 220 may be provided with threaded holes, and connection holes are arranged at corresponding locations on the laser 211. The connection holes on the laser 211 correspond to the screw holes one by one, screws are arranged in the connection holes and threaded holes, and the laser assembly 210 is fixed to the housing 220 by the connection holes, the threaded holes and the screws.

It need to be noted that, when the circuit board 212 and the laser 211 are both securely connected to the housing 220, since the pins 2111 of the laser 211 are attached to the first surface of the circuit board 212, the laser 211 may first be placed into the receiving region 2121 of the circuit board 212, the pins 2111 are soldered to the circuit board 212 to form the laser assembly 210, and then the laser assembly 210 as a whole is securely connected to the housing 220. Of course, alternatively, the circuit board 212 may first fixed to the housing 220, the laser 211 is then placed into the receiving region 2121 of the circuit board 212, the pins 2111 of the laser 211 are attached to the first surface of the circuit board 212, the laser 211 is fixed on the housing 220, and then the pins 2111 of the laser 211 are soldered to the circuit board 212. The laser 211 and the circuit board 212 of this embodiment may be fixed to the housing 220 following various orders, which may be selected as practically needed or work conventions, which will not be limited in this embodiment.

In addition, as shown in FIG. 3A and FIG. 3B, aside from receiving the laser 211, the receiving region 2121 on the circuit board 212 may be provided with positioning holes on the edges thereof. As shown in FIG. 4, the first bearing part 221 of the housing 220 is provided with positioning studs corresponding to the positioning holes. When the circuit board 212 is mounted onto the housing 220, the positioning studs of the housing 220 will be located in the positioning holes of the circuit board 212, which helps securing the position of the circuit board 212 on the housing 220. This also makes it easier to align the positions of the connection holes and the threaded holes, making the process of connecting the circuit board 212 to the housing 220 by the screws more convenient and efficient. The positioning hole may be separately provided from the receiving region 2121 according to the specific positions and dimensions of the positioning studs provided on the housing 220. The positioning holes may also be in communication with the receiving region 2121 as shown in FIG. 3A and FIG. 3B.

Similar to how the circuit board 212 is positioned on the housing 220, as shown in FIG. 3A and FIG. 3B, positioning holes may be arranged on the laser 211. As shown in FIG. 4, the second bearing part 222 of the housing 220 is provided with positioning studs corresponding to the positioning holes. When the laser 211 is mounted on the housing 220, the positioning studs of the housing 220 are located in the positioning holes of the laser 211, so as to facilitate securing the position of the laser 211 on the housing 220, as well as aligning the connection holes of the laser 211 with the screw holes of the housing 220, improving the convenience and efficiency in connecting the laser 211 and the housing 220 by screws.

As shown in FIG. 4 and FIG. 7, in order to provide better protection to the circuit board 212 and the laser 211, the housing 220 may further include a protection cover 230, which may be arranged at the outermost side of the housing 220. After the laser 211 and the circuit board 212 are fixed on the housing 220, the protection cover 230 is securely connected to the housing 220, covering up the entire laser assembly 210 to prevent scratching the surface of the circuit board 212 and the back of the laser 211, further enhancing the stability of the solder connection between the pins 2111 and the circuit board 212, and also preventing dust, moisture, etc., from infiltrating the housing 220 to harm the circuit board 212 and the laser 211.

A support block may be additionally arranged between the protection cover 230 and the circuit board 212 to support the protection cover 230, hence preventing potential damage to the circuit board 212 because of direct contact between the protection cover 230 and the circuit board 212.

The laser light source as described in this embodiment includes a laser assembly, where the laser assembly includes a laser and a circuit board, the laser includes a substrate and a light emitting chip arranged on the substrate. A light emitting surface of the laser is parallel to a plane where the substrate is located. A lateral surface of the substrate is provided with a plurality of pins extending outwards therefrom. The circuit board is arranged on the side where the pins extend. In addition, the circuit board is parallel to the plane where the substrate is located, and the circuit board is electrically connected to the pins. Thus, a plurality of pins extend out of the side of the substrate of the laser. By arranging the circuit board on the side where the pins extend, the pins of the laser may be brought into electrical connection with the circuit board, integrating the laser and the circuit board into an integral laser assembly, which facilitates assembling and disassembling of the laser and the housing. The laser and the circuit board do not have to be further separated after disassembling, nor will any damage be caused to the pins, so that the disassembling and assembling process may be simpler and faster.

Figure 8:
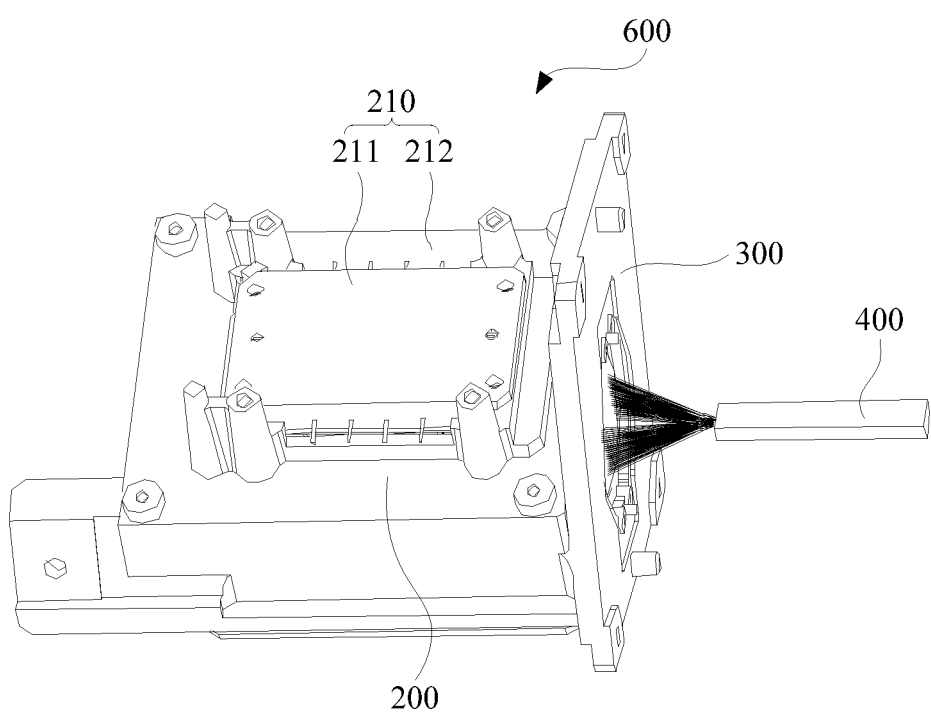
FIG. 8 is a schematic structural view of a laser projection device according to Embodiment 2 of the present application.
Figure 9:
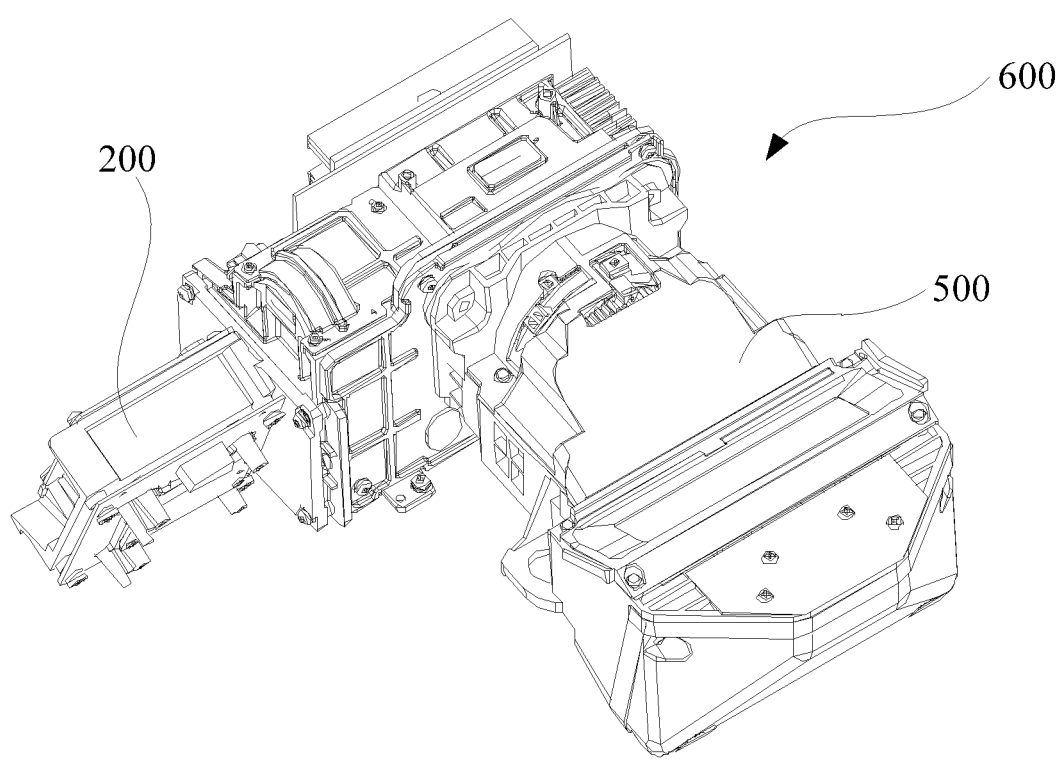
FIG. 9 is a schematic structural view of another laser projection device according to Embodiment 2 of the present application.

FIG. 8 is a schematic structural view of a laser projection device according to Embodiment 2 of the present application. FIG. 9 is a schematic structural view of another laser projection device according to Embodiment 2 of the present application. As shown in FIG. 8 and FIG. 9, Embodiment 2 of the present application provides a laser projection device 600, which includes the laser light source 200 according to Embodiment 1. The laser projection device provided by this embodiment mainly includes a laser light source 200, an optical machine and a lens assembly system 500. The specific structure, function and working principle of the laser light source 200 have been detailed in the above Embodiment 1, which will not be repeated herein.

Specifically, the laser projection device 600 also includes a lens 300, a light guide or a light stick 400, and the like. These components are arranged in the laser light source 200 or the optical engine. The laser light source 200 is configured to emit laser light to form a light source optical path. The light of emitted from the light source passes through the lens 300, where the light is condensed, and then propagates along the optical path to the light guide 400. The light guide 400 may apply homogenization to the light. The laser projection device 600 may also include a light valve, which receives the light emitting out of the light guide 400 and project the same into the lens assembly system 500 to create an image. The laser light source 200 includes a laser assembly 210 and a housing 220, where the laser assembly 210 includes a laser 211 and a circuit board 212. The laser 211 has pins 2111 for transmitting a signal. The pins 2111 extends outwards from the laser 211. The circuit board 212 is arranged outside the laser 211, electrically connected to the pins 2111, and arranged on the housing 220.

In the laser light source 200, the laser 211 and the circuit board 212 may form a laser assembly 210. The circuit board 212 is arranged outside the laser 211, with the pins 2111 of the laser 211 being attached to a first surface of the circuit board 212. By soldering the pins 2111 to the first surface of the circuit board 212, the electrical connection may be realized between the laser 211 and the circuit board 212. The laser assembly 210 formed by the laser 211 and the circuit board 212 offers a simple structure, a convenient assembling with the housing 220. Its dissembling simply requires separating the laser assembly 210 from the housing 220, without any need to further separate the laser 211 and the circuit board 212. This disassembling method is simpler and does not cause damage to the pins 2111. In addition, the circuit board 212, which is located in essentially the same plane as the laser 211, can shorten the optical path length along the direction in which the light source radiates.

The laser projection device provided in this embodiment includes a laser light source that, in turn, includes a laser assembly, where the laser assembly includes a laser and a circuit board, the laser includes a substrate and a light emitting chip arranged on the substrate. A light emitting surface of the laser is parallel to a plane where the substrate is located. A lateral surface of the substrate is provided with a plurality of pins extending outwards therefrom. The circuit board is arranged on the side where the pins extend. In addition, the circuit board is parallel to the plane where the substrate is located, and the circuit board is electrically connected to the pins. Thus, by arranging the circuit board outside the laser, the laser may be combined with the circuit board to form an integral laser assembly, which facilitates assembling and disassembling of the laser and the housing. The laser and the circuit board do not have to be further separated after disassembling, so that the disassembling and assembling process of the laser light source may be simpler and faster.

The application also provides a laser light source and a laser projection device with simple structures and small size. Most of the laser light sources of the related art laser projection devices use single-color laser light source, which is combined with a fluorescent wheel and various mirrors to meet the optical performance requirements. Specifically, taking a related art single-color laser light source as an example, the light source apparatus includes at least a blue laser, a fluorescent wheel and filter wheels. Using the blue laser, the blue laser light excites the fluorescent wheel, and emits red fluorescence (or yellow fluorescence, orange fluorescence) and green fluorescence by fluorescence conversion, which then pass through the filter wheels to be filtered and purified to obtain red fluorescence and green fluorescence with high purity, which are, in turn, combined with blue laser light to form a three-primary color light source. The three-primary color hybrid light travels through the illumination optical path of the optical engine, where it is reshaped and then projected onto a digital micromirror device (DMD). The DMD chip reflects the three primary color lights into a projection lens assembly, where the lights are calibrated and enlarged to project an image on a projection screen.

However, since the above single-color laser light source involves a plurality of filter wheels, as well as optical path components for the reshaping and converging in order to fulfill optical specifications such as fluorescence excitation and light gathering of the light stick, the light source system has a complicated structure and a large volume. Meanwhile, the conversion efficiency of fluorescence excitation is limited by temperature and excitation power, imposing a bottleneck on the brightness improvement of the overall light source. Moreover, the richness of the color created by the light source consisting of fluorescence and laser light falls far behind three-color laser light sources.

Figure 10:
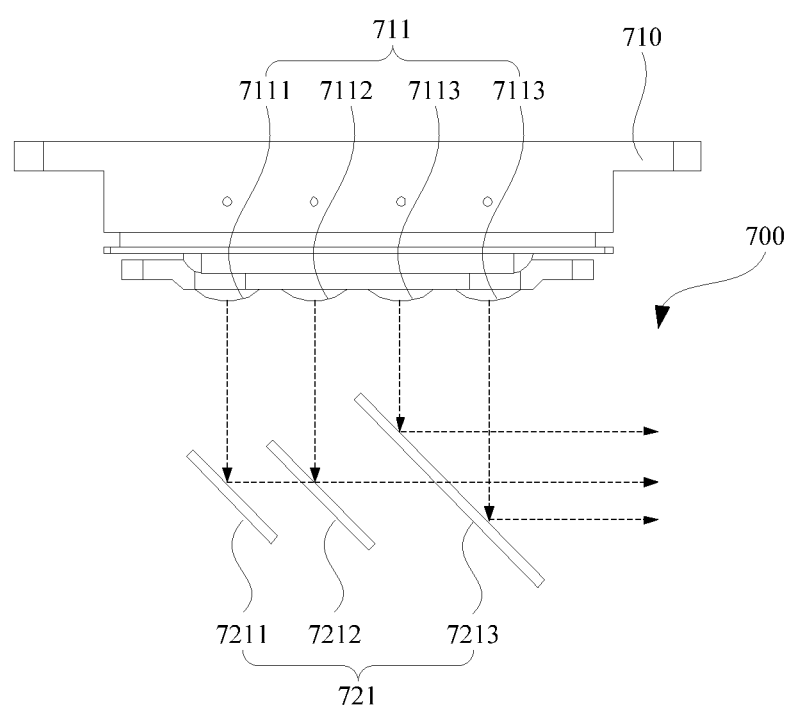
FIG. 10 is a schematic structural view of a laser light source according to Embodiment 3 of the present application.
Figure 11:
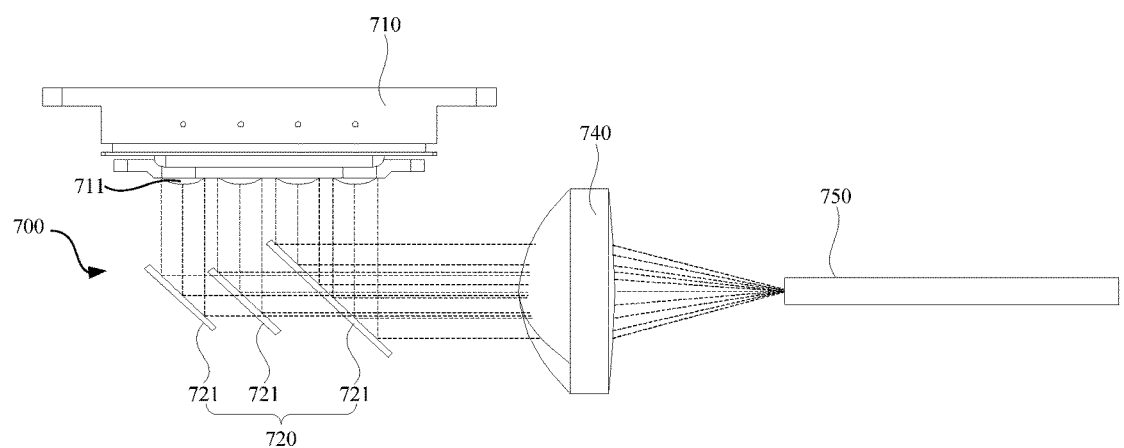
FIG. 11 is a schematic optical path diagramformed by a laser light source according to Embodiment 3 of the present application.
Figure 12:
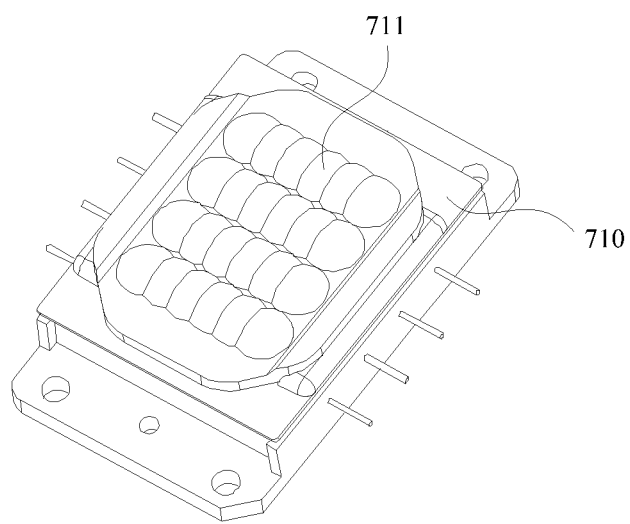
FIG. 12 is a schematic structural view of a laser according to Embodiment 3 of the present application.
Figure 13:
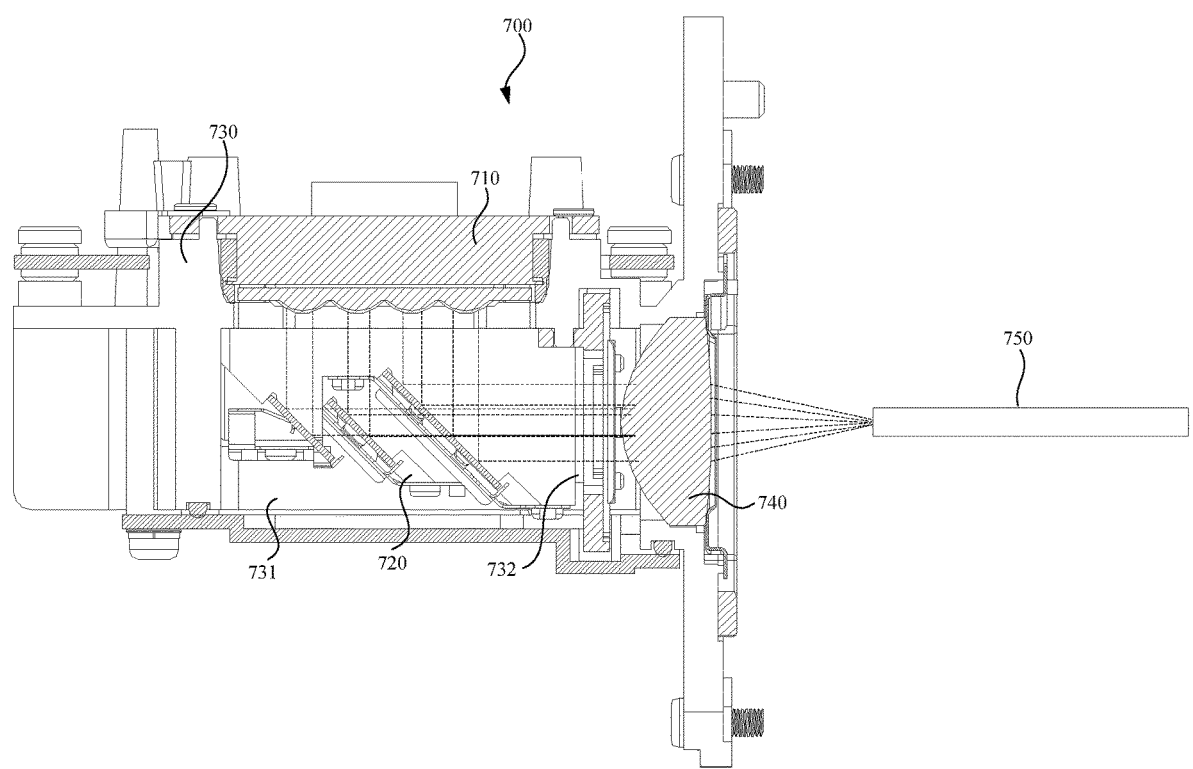
FIG. 13 is a schematic structural view of a laser light source according to Embodiment 3 of the present application.

Accordingly, Embodiment 5 of the present application provides a laser light source and a laser projection device. Specifically, as shown in FIG. 10 to FIG. 13, where FIG. 10 is a schematic structural view of a laser light source according to Embodiment 3 of the present application; FIG. 11 is a schematic optical path diagram formed by a laser light source according to Embodiment 3 of the present application; FIG. 12 is a schematic structural view of a laser according to Embodiment 3 of the present application; and FIG. 13 is a schematic structural view of a laser light source according to Embodiment 3 of the present application. The laser light source 700 provided by this embodiment includes a laser 710 and a light combination mirror assembly 720. A light emitting surface of the laser 710 has a plurality of light emitting regions 711, and beams emitted from the different light emitting regions 711 are in different colors. The light combination mirror assembly 720 includes a plurality of mirrors 721 that are sequentially arranged along the optical transmission path of the laser, with different mirrors 721 corresponding to different light emitting regions 711. An angle is formed between each mirror 721 and a light emitting direction of a corresponding light emitting region 711, for reflecting a beam emitted therefrom to the light emitting direction of the laser light source 700. The mirrors 721 are sequentially arranged along the light emitting direction of the laser light source 700, and at least one mirror 721 may allow other reflected beam to pass through itself, so that a beam reflected by the mirror 721 and a beam passing through the mirror 721 may emit along the light emitting direction of the laser light source 700.

The laser light source 700 of this embodiment includes a laser 710 and a light combination mirror assembly 720. A light emitting surface of the laser 710 has a plurality of light emitting regions 711 to emit a plurality of beams in different colors. The light combination mirror assembly 720 is used to receive and reflect the beams from the laser 710 in order to converge the plurality of beams in different colors into a white beam. As shown in FIG. 11, in the laser projection device including the laser light source 700 of this embodiment, a lens 740 and a light stick or light guide 750 are arranged, in this order, along the optical path formed by the laser light source 700. Eventually, the laser light source 700 creates white light that is first converged by the lens 740, then passes through the light stick 750 to undergo a homogenizing process, and then runs through the lens assembly to form an image on a projection screen.

In a specific embodiment, a diffusion sheet is arranged between the lens 740 and the light stick 750. The diffusion sheet is a rotating diffusion sheet capable of dissipating the speckles from the pure three-color laser beam output from the light source to improve the beam quality and mitigate the speckle effect in the projected image.

Specifically, the plurality of beams in different colors emitted from the plurality of light emitting regions 711 of the light emitting surface of the laser 710 may all face a first direction. That is, the emitting directions of the beams may be the same. The beams emitted from the laser 710 may all be projected onto the mirrors 721 of the light combination mirror assembly 720. The mirrors 721 in various colors may correspond to the beams in different colors from the light emitting regions 711 of the laser 710, so that the mirrors 721 may reflect beams in corresponding colors. Moreover, after the mirrors 721 receive and reflect the beams in their corresponding colors, the optical paths of the reflected beams will all be in a second direction, and the optical paths of the beams along the second direction may overlap with each other, so that such overlapping beams in different colors can converge together to form the white light.

It needs to be noted that, in this embodiment, the laser 710 can emit a plurality of beams in various colors, and the outgoing optical paths of all the beams are in the first direction. Therefore, the laser 710 should, first of all, has light emitting chips which can emit beams in different colors. that is, the light emitting regions 711 need to be capable of emitting beams in different colors, and the orientations of the light emitting surfaces of the light emitting chips capable of emitting such beams in different colors need to be uniform in order to ensure the optical paths of the beams emitted by all the light emitting chips are in the first direction.

The plurality of light emitting chips may be arranged on the laser 710 into a column, with the light emitting chips in the same column being spaced apart in order. That is, the plurality of light emitting regions 711 of the light emitting surface of the laser 710 are arranged at intervals in order, so that all the light emitting surfaces of the light emitting chips face the same direction. This ensures all the beams emitted from the light emitting chips propagate along the first direction, and the emitted beams do not overlap each other, thereby ensuring that the plurality of outgoing beams are single color beams colored corresponding with the light emitting chips. Thus, the plurality of light emitting regions 711 of the light emitting surface of the laser 710 can be arranged at intervals in one plane, which ensures that the laser 710 is a thin-plate laser with a relatively simple structure.

Alternatively, the plurality of light emitting chips on the laser 710 may not be arranged in the same column, and they may be arranged into a cross form, as long as the light emitting surfaces of all the light emitting chips still have the same orientation. Additionally, the optical paths of the emitted beams on the light emitting surfaces of the light emitting chips shall not overlap each other, that is, the light emitting chips arranged in the cross form need to be spaced apart from each other in the first direction to ensure that the optical paths of the beams of different colors emitted from the light emitting chips do not overlap each other. Thus, all beams in the first direction are single color beams. In order to simplify the structure of the laser 710 even further and to reduce the space occupied by the laser 710 in the laser light source 700, all the light emitting chips are preferably arranged in the same column, and the structure can be relatively simpler if all the light emitting chips are packaged into the same column in the laser 710. This also reduces the overall thickness of the laser 710.

Individual transparent mirrors 721 in the light combination mirror assembly 720 need to meet at least the following conditions.

First, each mirror 721 need to be arranged in the optical path of the beam corresponding to the color thereof. The reflection surface of the mirror 721 should face the emitting direction of the beam, so that the mirror 721 may reflect the beam in the corresponding color when the beam irradiates on the reflection surface of the mirror 721.

Second, for the beam emitted from the laser 710 to be reflected, an angle needs to be formed between the mirror 721 and emitting optical path of the beam, i.e., the first direction. Also, the reflection surface of the mirror 721 should not be perpendicular to the first direction. This is how the mirror 721 can reflect the beam so that the reflection optical paths formed by the reflected beams, i.e., the second direction, and the first direction forms an angle, rather than being in the same direction or opposite directions, thus all the beams in the reflection optical paths may converge to form the white light.

Third, the reflection surface of the mirror 721 need to be able to cover the spot area of the beam in the corresponding color emitted by the laser 710. That is, the emitted beam need to be able to entirely irradiate on the reflection surface of the mirror 721, so that the mirror 721 can reflect all the lights emitted by the laser 710. This can, in one aspect, improve the utilization ratio of the light emitted from the laser 710 by the light combination mirror assembly 720 and, more importantly, ensure that the laser light source 700 does not generate unwanted light loss, thereby ensuring that the laser light source 700 has a good performance.

Fourth, after all the mirrors 721 reflect the corresponding beams, the reflection optical paths are all formed in the second direction, and all the beams in the second direction need to be able to converge to form white light. Considering that all the beams emitted by the laser 710 face the first direction, therefore, the inclination angles of all the mirrors 721 with respect to the first direction need to be the same to ensure that the reflected beams are in the second direction after being reflected by the mirrors 721. In addition, each mirror 721 need to be appropriately positioned along the first direction according to the angle between the mirrors 721 and the first direction, so that all the beams reflected in the second direction may overlap with each other, converging to form the white light.

Fifth, as mentioned above, each mirror 721 is arranged corresponding to the beam of the corresponding color emitted by the laser 710, the optical paths of the beams emitted by the laser 710 are all in the first direction, all the mirrors 721 reflect the beams to the second direction, and the beams in the second direction can converge to form white light. Therefore, while one mirror 721 reflects the beam in the same color as itself in the second direction, the mirror 721 should not block the reflection optical path of other beams reflected in the second direction by other mirrors 721. The structure of the mirror 721 can be selected such that when the mirror 721 reflects the beam in the color corresponding to its own, beams of other colors can pass through the mirror 721, so that all the beams in the second direction may converge to form the white light. Or, the spacing between the mirrors 721 may be appropriately designed to ensure that none of the mirrors 721 is in the reflection optical path of the beams from other mirrors 721, i.e., none of the mirrors 721 obstructs the reflection optical path of other beams, and all of the mirrors 721 can cause the reflection optical paths of the reflected beams overlap with each other, converging to form white light.

As described above, the laser light source 700 of this embodiment may include a laser 710 that can emit beams of different colors and a light combination mirror assembly 720 that can reflect beams of different colors. The optical paths of the beams of different colors emitted by the laser 710 are all along the first direction. The light combination mirror assembly 720 includes mirrors 721 of different colors. The mirrors 721 correspond to different light emitting regions 711 of the light emitting surface of the laser 710. The mirrors 721 reflect the beams emitted from the corresponding light emitting regions 711, and the reflection optical paths formed by all the beams reflected by all the mirrors 721 are all in the second direction, all overlapping with each other and converging to form white light. The laser 710 and the light combination mirror assembly 720 of the laser light source 700 of this embodiment have a relatively simple structure, and the laser light source 700 can be made smaller on the basis of meeting the performance requirements of the laser light source 700.

In order to make sure that the mirrors 721 reflect the beam corresponding to their own colors without interfering with the reflection optical path of the beams reflected by other mirrors 721, that is, to make sure all the beams reflected by the mirrors 721 can converge into white light in the second direction, the plurality of mirrors 721 of this embodiment include a reflection mirror and at least one light combination mirror, where the light combination mirror is used for reflecting the beam emitted by the corresponding light emitting region 711 while allowing the beams corresponding to the other light emitting regions 711 to pass through, and the reflection mirror is used for reflecting the beam emitted by the corresponding light emitting region 711.

As shown in FIG. 10, the plurality of mirrors 721 includes at least one light combination mirror, also known as dichroic mirror. The light combination mirror is characterized in that the light of a certain wavelength almost completely pass through while other wavelengths are almost completely reflected. The mirror 721 of this embodiment adopts a light combination mirror, which can almost completely reflect the beam corresponding to its own color, so that the beam of the color emitted by the laser 710 may form a reflection optical path in the second direction after being reflected by the light combination mirror. When the beam reflected by the other mirror 721 needs to pass through the light combination mirror in the second direction to converge with other beams to form the white light, the light combination mirror can allow beams of other colors to pass through without blocking the reflection optical paths of the beams of other colors, thereby ensuring that all color beams can converge in the second direction to form white light.

In addition, as shown in FIG. 10, the plurality of mirrors 721 include a reflection mirror for reflecting the beams corresponding to the colors of the mirror, and the reflection mirror is not in the way of the optical paths of the beams of other colors. The mirror 721 does not block the reflection optical paths of the beam reflected by other mirrors 721 in the second direction. When the mirror 721 does not in any way interfere with the forming of the white light by converging the beams in the second direction regardless of whether the mirror 721 is a light combination mirror, the mirror 721 may be provided as a reflection mirror. That is, the mirror 721 as a reflection mirror only needs to reflect the beams corresponding to its own color, without having to let beams of other colors to pass through.

It need to be noted that, the plurality of mirrors 721 do not have to include any reflection mirror. Rather, the mirrors 721 may all be light combination mirrors. In one aspect, the light combination mirror satisfies the condition that the beam corresponding to the color of the mirror itself shall be reflected while beams of other colors can pass through, fulfilling the functional requirements for the mirrors 721, ensuring that all the beams reflected by the light combination mirror assembly 720 are converged into the white light in the second direction. In another aspect, when the light combination mirror assembly 720 is fabricated, the manufacturing processes of individual mirrors 721 do not have to be differentiated, thus reducing the probability of encountering errors in the manufacturing and assembling process to some extent.

Further, the light emitting surface of the laser 710 has three light emitting regions 711 that are, respectively, a green light emitting region 7111 for emitting a green beam, a blue light emitting region 7112 for emitting a blue beam, and a red light emitting region 7113 for emitting a red beam.

As shown in FIG. 10, the laser 710 of this embodiment, which can emit a plurality of beams of different colors, can specifically emit beams in three different color, which may include a green beam, a blue beam, and a red beam. Additionally, the outgoing optical paths of the green, blue, and red beams are all in the first direction, where the green, blue, and red beams converge to form white light. Accordingly, a light emitting surface of the laser 710 has three different light emitting regions 711 that are, respectively, a green light emitting region 7111 that may emit a green beam, a blue light emitting region 7112 that may emit a blue beam, and a red light emitting region 7113 that may emit a red beam.

Similarly, the plurality of mirrors 721 may specifically include mirrors 721 in three different colors, including a green mirror, a blue mirror and a red mirror, which correspond to the green beam, the blue beam and the red beam, respectively.

Specifically, the green mirror is arranged in the outgoing optical path of the green beam, the blue mirror is arranged in the outgoing optical path of the blue beam, and the red mirror is arranged in the outgoing optical path of the red beam. Reflection surfaces of the green mirror, the blue mirror and the red mirror all face the outgoing optical paths of the corresponding colored beams, that is, the reflection surfaces are all oriented toward the first direction. Additionally, an angle is formed between the reflection surface and the first direction to reflect the beams of the various colors into the second direction. Regardless of whether being a green mirror, a blue mirror or a red mirror, the reflection surface thereof always need to be able to receive the entire beam of the corresponding green, blue and red to ensure the performance of the laser light source 700 and the image quality of the projection on the screen. Additionally, the reflection surfaces of the green mirror, the blue mirror and the red mirror are parallel to each other, and the specific arrangement of the three mirrors should ensure that the reflected green, blue and red beams converge in the second direction together to form white light.

In a specific embodiment, the plurality of mirrors 721 include a reflection mirror 7211, a first light combination mirror 7212 and a second light combination mirror 7213 arranged in order along the light emitting direction of the laser light source 700. As described above, considering the reflection optical paths of the green, blue, and red beams after being reflected by the green mirror, the blue mirror and the red mirror in the second direction, if beams of one or two colors have to pass through some other mirror 721 in order to converge with the beams of other colors, the some other mirror 721 must be able to, in addition to reflect a beam in the same color as its own, allow beams in other colors that need to pass through the mirror itself pass through. Such a mirror 721 may be provided as a light combination mirror. For example, a green mirror that only needs to reflect the green beam may be a reflection mirror 7211. If a green beam needs to pass through a blue mirror, the blue mirror may be arranged as the first light combination mirror 7212 that reflects the blue beam and allows the green beam pass through. If a green beam and a blue beam need to pass through a mirror, the red mirror may be arranged as the second light combination mirror 7213 that reflects the red beam and allows the green beam and the blue beam pass through.

Further, still referring to the above embodiment where the light combination mirror assembly 720 includes the reflection mirror 7211, the first light combination mirror 7212 and the second light combination mirror 7213, the reflection mirror 7211 corresponds to the green light emitting region 7111 and is used to reflect the green beam, the first light combination mirror 7212 corresponds to the blue light emitting region 7112 and is used to allow the green beam pass through and to reflect the blue beam, and the second light combination mirror 7213 corresponds to the red light emitting region 7113 and is used to allow the green beam and the blue beam pass through and reflect the red beam.

As shown in FIG. 10, the reflection mirror 7211, the first light combination mirror 7212 and the second light combination mirror 7213 are arranged in order and spaced apart along the second direction, i.e., along the light emitting direction of the laser light source 700. Accordingly, the green beam, the blue beam and the red beam that emitted respectively from the green light emitting region 7111, the blue light emitting region 7112 and the red light emitting region 7113 of the laser 710 to the first direction are also arranged at intervals along the second direction. The green beam, the blue beam and the red light irradiate on the reflection surfaces of the reflection mirror 7211, the first light combination mirror 7212, and the second light combination mirror 7213, respectively. The reflection mirror 7211, the first light combination mirror 7212 and the second light combination mirror 7213 arranged at intervals enable the green, blue and red beams to be reflected into the second direction and converge to form white light there.

In addition, the spacing among the reflection mirror 7211, the first light combination mirror 7212 and the second light combination mirror 7213 in a direction perpendicular to the light emitting surface of the laser 710 should not be too narrow, so as to ensure that the beams emitted from the respective light emitting regions 711 may irradiate on their corresponding mirrors 721 without being blocked by the other mirrors 721. If the spacing among the mirrors 721 is too narrow, and the beam from any of the light emitting regions 711 is blocked by other mirror 721, the corresponding mirror 721 will fail to effectively reflect the beam of the corresponding color. If this is case, poor optical properties of the beam formed in the second direction by converging the various beams will be produced. It may even be possible that the beam of one or two colors cannot be reflected into the second direction, preventing white light from being formed in the second direction, causing the laser light source 700 to fail to serve its function.

The second light combination mirror 7213 has a larger surface area than the first light combination mirror 7212 and the reflection mirror 7211. As shown in FIG. 10, the second light combination mirror 7213 corresponds to the red light emitting region 7113, and is used to reflect the beam emitted from the red light emitting region 7113 into the light emitting direction of the laser light source. Since the area of beam emitted by the red light emitting region 7113 is larger than the area of beams emitted by the blue light emitting region 7112 and the green light emitting region 7111, in order for the second light combination mirror 7213 to receive the entire beam emitted from the red light emitting region 7113. Specifically, illustrating with a red light emitting region 7113 having a light emitting area twice of the blue light emitting region 7112 and the green light emitting region 7111, the area of the beam emitted by the red light emitting region 7113 is two times than that of the blue light emitting region 7112 and the green light emitting region. Illustrating with a blue light emitting region 7112 and a green light emitting region 7111, each having one light emitting chip, and a red light emitting region 7113 having two light emitting chips, the second light combination mirror 7213 corresponding to the red light emitting region 7113 need to have a surface area that ensures that the mirror may receive the entire beams irradiated from the two light emitting chips.

It needs to be noted that the red light emitting region 7113 has been arranged to have a larger surface area than the blue light emitting region 7112 and the green light emitting region 7111, and correspondingly, a second light combination mirror 7213 has a larger surface area than the first light combination mirror 7212 and the reflection mirror 7211, in order for the red light emitting region 7113 of the laser 710 to emit more red beams and for the second light combination mirror 7213 to reflect the entire red beams into the light emitting direction of the laser light source 700, thereby enabling the reflected beams respectively from the second light combination mirror 7213, the first light combination mirror 7212 and the reflection mirror 7211 to converge to form white light, to fulfill the lighting effect requirement of the laser light source.

In a specific embodiment, the angle between a mirror 721 and its corresponding light emitting region is greater than or equal to 43 degrees, and less than or equal to 47 degrees. The angle between the mirror 721 and the light emitting region is around 45 degrees, where the light emitting direction of the light emitting region 711 is perpendicular to the light emitting surface. That is, the angle between the mirror 721 and the light emitting region 711 is also around 45 degrees. Thus, the light emitting direction of the light emitting region 711, i.e., the first direction, is perpendicular to the light emitting direction of the laser light source 700, i.e., the second direction. The plurality of mirrors 721 are arranged in order at intervals along the second direction, thus obtaining a simplified structure for the overall laser light source while facilitating the setup of the light combination mirror assembly 720.

As shown in FIG. 10, in order to make the structure of the laser light source 700 of this embodiment simpler and its volume smaller, in a specific embodiment, an angle of 45°±2° is formed between reflection surfaces of a reflection mirror 7211, a first light combination mirror 7212 and a second light combination mirror 7213 and a green beam, a blue beam and a red beam emitted along a first direction. Thus, an angle of around 90° may be formed between the reflection optical path of the beams reflected from the reflection mirror 7211, the first light combination mirror 7212 and the second light combination mirror 7213, i.e., the second direction, and the light emitting optical path of each beam, i.e., the first direction. That is, the second direction and the first direction are perpendicular to each other. The reflection mirror 7211, the first light combination mirror 7212 and the second light combination mirror 7213 may be sequentially arranged and spaced apart along a second direction perpendicular to the first direction, thus the light combination mirror assembly 720 forming by the reflection mirror 7211, the first light combination mirror 7212 and the second light combination mirror 7213 has a relatively simple structure and occupies a small space.

Further, the distance between the highest point of each mirror 721, i.e., the point nearest to the light emitting surface of the laser 710, and the light emitting surface of the laser 710 is greater than or equal to 1 mm and less than or equal to 40 mm. The mirrors 721 are arranged along the light emitting direction of the laser light source 700, i.e., the second direction, and the reflection surface of the mirror 721 are arranged with respect to the light emitting surface of the laser 710. The distance between the highest point of each mirror 721 and the light emitting surface of the laser 710 may be set between 1 mm and 40 mm. This can, on the basis of ensuring that the beam from the light emitting region 711 of the laser 710 can irradiate on the reflection surface of the mirror 721, enable the mirrors 721 to better receive the beams emitted from the light emitting region 711 of the laser 710.

For the spacing between the reflection mirror 7211, the first light combination mirror 7212 and the second light combination mirror 7213, the distance between the second light combination mirror 7213 and the first light combination mirror 7212 along a center line may be greater than or equal to 1 mm and less than or equal to 11 mm; and/or, the distance between the first light combination mirror 7212 and the reflection mirror 7211 along the center line may be greater than or equal to 0.5 mm and less than or equal to 10.5 mm.

As shown in FIG. 10, an angle of round 45 degrees may be formed between the first direction and the reflection surfaces of the second light combination mirror 7213, the first light combination mirror 7212 and the reflection mirror 7211. The second light combination mirror 7213, the combined light combination mirror 7212 and the reflection mirror 7211 may be sequentially spaced out along a second direction perpendicular to the first direction, with the second light combination mirror 7213 being arranged in the outgoing optical path of the red beam, the first light combination mirror 7212 being arranged in the outgoing optical path of the blue beam, and the reflection mirror 7211 being arranged in the outgoing optical path of the green beam. With respect to the spacings between the mirrors 721, too narrow a spacing may prevent the beam from the light emitting region 711 from irradiating entirely on the corresponding mirror due to the shading by the other mirrors 721, leading to a small area of the beam reflected by the corresponding mirror, which causes an optical loss that may affect the performance of the laser light source 700. On the other hand, too wide a spacing may prevent the mirror 721 from fully aligning with the outgoing optical path of the beam in a corresponding color, that is, the mirror 721 will be unable to reflect the entire light of the corresponding beam into the second direction, which may also negatively impact the performance of the laser light source 700.

In general, in order to achieve better performance for the laser light source 700, the red beam may include more the amount of light than the blue and green beams. As shown in FIG. 10, in a specific embodiment, the laser 710 may include two adjacently arranged light emitting chips that emit red beams, and arranged in order light emitting chip that emit the blue beam and the light emitting chip that emit the green beam. The reflection surface of the second light combination mirror 7213 corresponding to the red beam need to be able to receive all the lights of the two red beams, and thus a slightly wider spacing may be provided between the second light combination mirror 7213 and the first light combination mirror 7212. Specifically, the spacing between the second light combination mirror 7213 and the first light combination mirror 7212 may be 6±5 mm, and the spacing between the first light combination mirror 7212 and the reflection mirror 7211 may be 5.5±5 mm, so as to ensure each of the mirrors 721 receives all of the lights of the corresponding beam and that each mirror 721 is capable of reflecting the entire beam in the corresponding color, thereby providing improved performance for the laser light source 700.

In a specific embodiment, the laser light source 700 further includes a housing 730 having a receiving cavity 731, where the laser 710 and the light combination mirror assembly 720 are at least partially accommodated in the receiving cavity 731. The receiving cavity 731 has an opening 732 facing a light emitting direction of the laser light source 700.

As shown in FIG. 13, the laser light source 700 of this embodiment further includes a housing 730 for accommodating and fixing the laser 710 and the light combination mirror assembly 720. Specifically, the relative positions between the laser 710 and the light combination mirror assembly 720 are determined according to the structures of the laser 710 and the light combination mirror assembly 720 and the optical path formed between them. The housing 730 has a receiving cavity 731, in which the laser 710 and the light combination mirror assembly 720 may be accommodated. The laser 710 and the light combination mirror assembly 720 may be partially or fully accommodated in the receiving cavity 731 according to how the laser 710 and the light combination mirror assembly 720 are mounted in the housing 730.

An opening 732 may also be provided in the receiving cavity 731 of the housing 730. The opening 732 may face the light emitting direction of the laser light source 700, that is, the opening 732 is arranged in the second direction. The opening 732 is used to allow the white light formed by the convergence of all the beams along the second direction pass through. That is, the white light formed by the convergence of the reflected beams from the mirrors 721 will emit out from the opening 732.

In a specific embodiment, the laser light source 700 of this embodiment further includes a lens 740 arranged at the opening 732. A lens 740 and a light stick 750 may be sequentially arranged on the light emitting side of the mirror 721 along the direction of the opening 732 of the receiving cavity 731 of the housing 730. After passing through the opening 732, the white light is converged by the lens 740, and then homogenized by the light stick 750.

Specifically, the distance between the optical axis of the lens 740 and the light emitting surface of the laser 710 is greater than or equal to 6 mm. In this way, a beams emitted from the light emitting surface of the laser 710 may, after being reflected by the mirror 721, irradiate on the lens 740, thereby ensuring that the lens 740 may receive the reflected beams while forming the overall structure of the laser light source 700 with a small size. The specific spacing between the optical axis of the lens 740 and the light emitting surface of the laser 710 may be determined according to the spacing between the mirror 721 and the light emitting surface of the laser 710 to ensure that the lens 740 can receive the beams reflected by all the mirrors 721.

Additionally, the diameter of the lens 740 may be greater than 20 mm. The selected lens 740 having a diameter greater than 20 mm in order to ensure that the lens 740 has a sufficient concentrating area to allow all the beams reflected from the mirrors 721 to irradiate on the lens 740, and further the lens 740 may converge the beams, thereby ensuring good optical performance for the laser light source 700.

In another specific implementation, a diffusion sheet or diffusion wheel structure may further be arranged between the lens 740 and the light stick 750. For example, a diffusion sheet or a diffusion wheel may be arranged at around 2 mm from the light entrance port of the light stick 750, or 20 mm from the light emitting surface of the lens 740, according to the light receiving angle requirement of the system.

FIG. 12 is a schematic structural view of a laser according to Embodiment 3 of the present application. The laser 710 may have a structure, a function and an operation principle similar to the laser 211 according to the Embodiment 1 of the present application, which will not be repeated herein. In addition, the housing 730 of the laser light source 700 provided in this Embodiment 3 has a structure and function similar to the housing 220 in the laser light source 200 provided in the Embodiment 1 of the present application, the details of which may be found in the detailed description of the foregoing embodiments, which will not be repeated herein.

The laser light source 700 in the Embodiment 3 may further include a circuit board. The laser 710 is connected to the circuit board, and the laser 710 is turned on by the circuit board, so that the light emitting region 711 of the light emitting surface of the laser 710 may emit beams. For the shape and structure of the circuit board in this embodiment and the relative position relationship and connection relationship between the laser and the circuit board, reference may be made to the detailed description of the foregoing embodiments, which will not be repeated herein.

Moreover, the laser 710 may be fixed to the housing 730 by a fixed connection between the circuit board on the periphery of the sidewalls of the laser 710 and the housing 730. For the connections between laser 710, the circuit board and the housing 730, reference may be made to the detailed description of the foregoing embodiments, which will not be repeated herein.

The laser light source according to this embodiment includes a laser and a light combination mirror assembly. A light emitting surface of the laser has a plurality of light emitting regions, and beams emitted from the different light emitting regions are in different colors. The light combination mirror assembly includes a plurality of mirrors that are arranged in order along the optical transmission path of the laser, with different mirrors corresponding to different light emitting regions. An angle is formed between each mirror and a light emitting direction of a corresponding light emitting region, for reflecting a beam that is emitted from the light emitting region to the light emitting direction of the laser light source. The mirrors are arranged in order along the light emitting direction of the laser light source, and at least one of the mirrors allows other reflected beams to pass therethrough, so that the beam reflected by the mirror and the beam passing through the mirror may emit along the light emitting direction of the laser light source. By providing, in the optical transmission path of the beam emitted from the laser, a light combination mirror assembly whose various lenses correspond one-on-one to various light emitting regions of the laser and have an angle relative to respect to the light emitting direction of the light emitting region, the emitted beam may be reflected to the light emitting direction of the laser light source, and at least one lens can allow the beams reflected by other lens pass through, so that the beams reflected by all the lenses can emit in the light emitting direction of the laser light source. Such a laser light source including a laser 710 that can emit beams of different colors and a light combination mirror assembly having lenses corresponding to the plurality of light emitting regions has a simple structure and a small volume.

Figure 14:
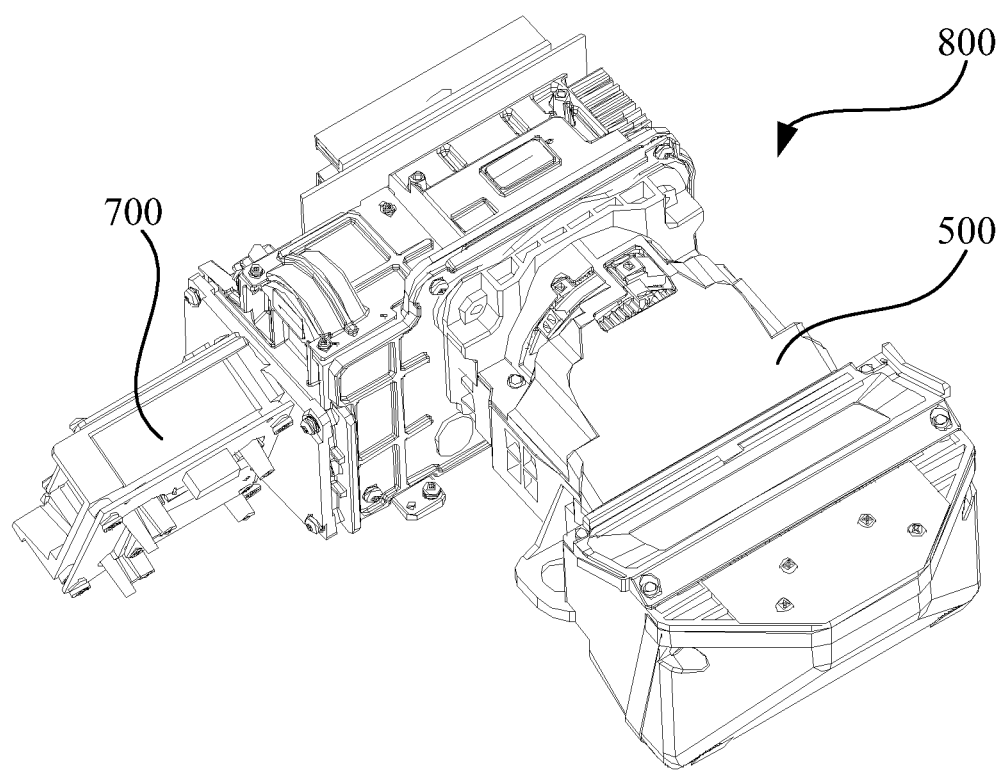
FIG. 14 is a schematic structural view of a laser projection device according to Embodiment 4 of the present application.

FIG. 14 is a schematic structural view of a laser projection device according to Embodiment 4 of the present application. As shown in FIG. 14, this embodiment provides a laser projection device 800, which includes the laser light source 700 according to Embodiment 3. The laser projection device provided in this embodiment includes a laser light source 700, a light valve (not shown), a lens assembly system 500, and the like.

The laser light source 700 includes a laser 710 and a light combination mirror assembly 720. A light emitting surface of the laser 710 has a plurality of light emitting regions 711, and beams emitted from the different light emitting regions 711 are in different colors. The light combination mirror assembly 720 includes a plurality of mirrors 721 that are arranged at intervals along the optical transmission path of the laser, with different mirrors 721 corresponding to different light emitting regions 711. An angle is formed between the mirrors 721 and a light emitting direction of a light emitting region 711 for reflecting the beam emitting therefrom to the light emitting direction of the laser light source 700. The mirrors 721 are arranged in order along the light emitting direction of the laser light source 700, and at least one mirror 721 may allow beams in colors corresponding to other light emitting regions 711 pass through, so that the beams reflected by the mirror 711 may all emit out along the light emitting direction of the laser light source 700.

The laser 710 of the laser light source 700 may be provided in order on the light emitting surface thereof with a plurality of light emitting regions 711 emitting beams of various colors. The outgoing optical paths of the beams of various colors emitted from the light emitting regions 711 are all along the first direction. The light combination mirror assembly 720 includes a plurality of mirrors 721 in different colors. The plurality of mirrors 721 are in one-to-one correspondence with the plurality of light emitting regions 711. A mirror 721 is arranged in an outgoing optical path of a light emitting region 711 that emits a beam in a corresponding color, and the corresponding mirror 721 may reflect a beam in the corresponding color. The reflected beams are all in the second direction, and the beams in the second direction can converge to form white light.

The specific structure, function and working principle of the laser light source 700 have been detailed in the above Embodiment 3, which will not be repeated herein.

In a specific embodiment, a laser projection device 800 further includes a diffusion sheet and a light stick 750, where the diffusion sheet is arranged on the outgoing optical path of the laser light source 700, and a beam that has been diffused by the diffusion sheet will irradiate on the light stick 750.

Specifically, the laser projection device 800 further includes a lens 740, a diffusion sheet, and a light stick 750, which are arranged opposite to the laser light source 700. The laser light source 700 is configured to emit laser lights and to form a light source optical path. The beams emitted from the light emitting direction will pass through the lens 740, where the beams are converged. The beams converged by the lens 740 will pass through the diffusion sheet, which may be a rotating diffusion sheet that dissipates the speckles from the beam, in order to enhance the quality of the beam and to mitigate speckle effect in the projected image. After that, the beam irradiates on the light stick 750, which may homogenize the beam. The laser projection device 800 may further include a light valve, which receives the light emitted from the light stick 750 and projects the same into the lens assembly system 500 for projecting an image.

In this embodiment, the laser projection device includes a laser light source, which in turn includes a laser and a light combination mirror assembly. A light emitting surface of the laser has a plurality of light emitting regions, and beams emitted from the different light emitting regions are in different colors. The light combination mirror assembly includes a plurality of mirrors that are arranged in order along the optical transmission path of the laser, with different mirrors corresponding to different light emitting regions. Each mirror forms an angle relative to a light emitting direction of a corresponding light emitting region, for reflecting a beam emitted therefrom to the light emitting direction of the laser light source. The mirrors are arranged in order along the light emitting direction of the laser light source, and at least one mirror may allow beams in colors corresponding to other light emitting regions pass through, so that the beams reflected by the mirror may all emit out along the light emitting direction of the laser light source. Such a laser light source including the laser and the light combination mirror assembly has a simple structure and a small volume.

Figure 15:
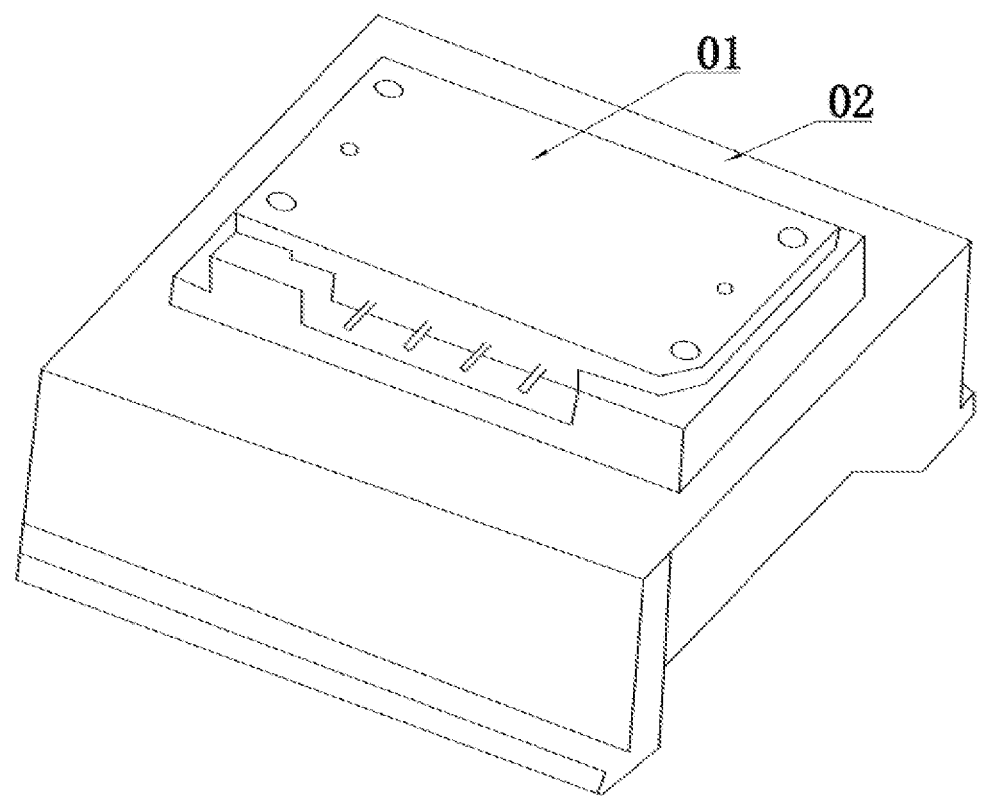
FIG. 15 is a schematic structural view of a laser light source according to an embodiment of the present application.

The present application also provides a laser light source and a laser projection device, which provides a solution to a sealing problem between the laser and the housing, to prevent dust ingress at the joint seam between the laser and the housing for an inner cavity of the laser light source, thereby helping to ensure the service life of the laser light source. The laser light source is a light source module, one of the core components of a laser display apparatus. Typically, a laser light source includes a laser and a housing for mounting the optical assembly. FIG. 15 is a schematic structural view of a laser light source according to an embodiment of the present application. As shown in FIG. 15, the laser light source includes a laser 01 and a housing 02. The housing 02 is provided with a laser mounting port, in which the laser 01 is embedded, and securely connected to the housing 02. The optical component is mounted in the inner cavity of the housing 02.

Figure 16:
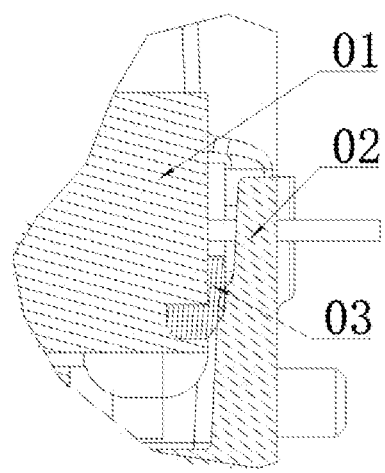
FIG. 16 is a schematic structural view of sealing and assembling a laser light source according to an embodiment of the present application.

In order to improve the sealing between the laser 01 and the housing 02 and to prevent dust ingress at the joint seam between the laser 01 and the housing 02 for the cavity within the laser light source, a sealing element 03 is typically required at the fitting joint between the laser 01 and the housing 02. FIG. 16 is a schematic structural view of sealing and assembling a laser light source. As shown in FIG. 16, the sealing element 03 is structured to have a ring-shaped protuberance structure on its inner surface, which is locked in a groove on a lateral surface of the laser 01. An outer side of the sealing element 03 is attached to the housing 02. The sealing element 03 is interference-fitted with, and deformed by the pressure from, the housing 02, thereby forming a mutual sealing among the laser 01, the housing 02 and the sealing element 03.

However, since the groove on the lateral surface of the laser 01 is relatively narrow, usually only about 1 mm, it is necessary to assist with a tool to fit the sealing element 03 into the groove on the lateral surface of the laser 01, which tend to complicate the assembling of, and increase the time consumed in, fitting the sealing element 03. One may realize, in assembling the laser 01, the housing 02 and the sealing element 03, that when the laser 01 pre-fitted with the sealing element 03 is assembled to the housing 02, the sealing element 03 tend to, when squeezed by the housing 02, slip out of the groove on the lateral surface of the laser 01, creating an uneven contact between the sealing element 03, the laser 01 and the housing 02, which leads to poor sealing between the laser 01 and the housing 02, dust ingress from the air into the cavity of the housing 02, and reduced service life for the laser light source.

Figure 17:
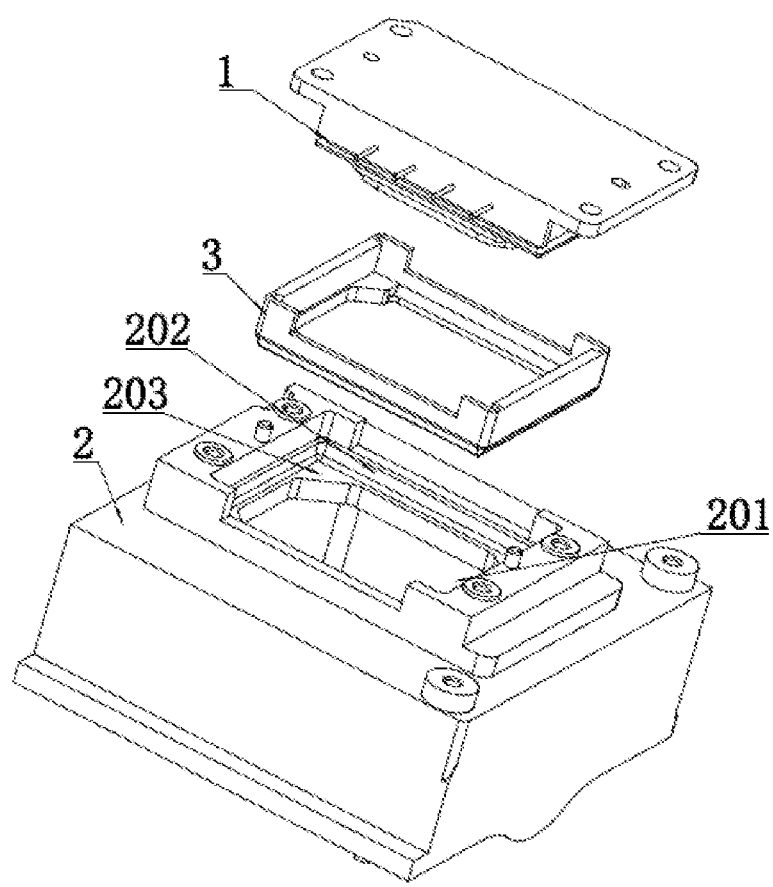
FIG. 17 is an exploded view of a laser light source according to Embodiment 5 of the present application.

Accordingly, Embodiment 5 of the present application provides a laser light source and a laser projection device to solve the sealing problem between the laser and the housing, so as to prevent dust ingress at the joint seam between the laser and the housing for the inner cavity of the laser light source, thereby helping to ensure the service life of the laser light source. FIG. 17 is a schematic structural view of a laser light source according to Embodiment 5 of the present application. As shown in FIG. 17, the laser light source provided by the embodiment of the present application includes a laser 1, a housing 2 and a sealing element 3.

Figure 18:
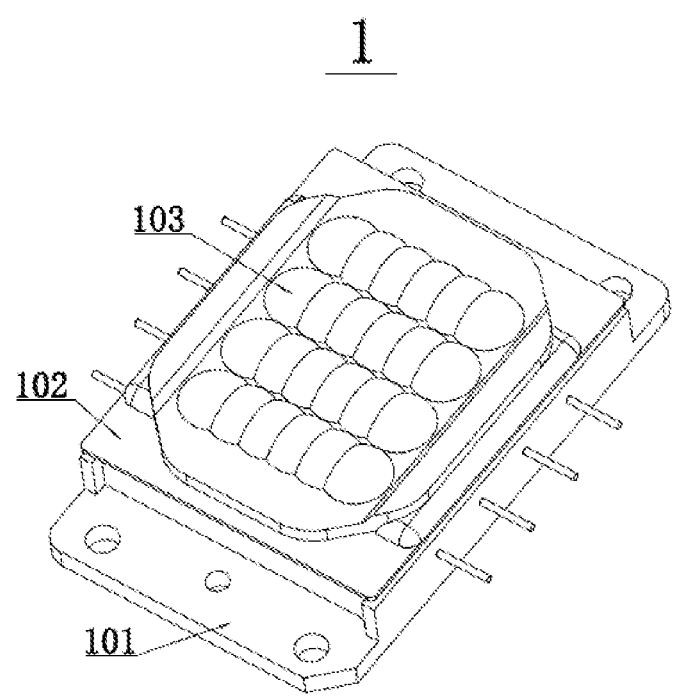
FIG. 18 is a schematic structural view of a laser according to Embodiment 5 of the present application.

FIG. 18 is a schematic structural view of a laser according to Embodiment 5 of the present application. As shown in FIG. 18, the laser 1 includes a base 101 and a substrate 102. The base 101 fixes, supports, and is connected to, one surface of the substrate 102. Another side of the substrate 102 is provided with a light emitting chip. The side of the substrate 102 with the light emitting chip is a light emitting surface on the substrate 102. The laser 1 is securely connected via the base 101 to the housing 2.

Further, the laser 1 also includes a compound-eye lens 103, which is arranged on a light emitting surface of the light emitting chip, and securely connected to the substrate 102. The light emitting surface of the substrate 102 has, in addition to planes occupied by the compound-eye lens 103, some uncovered surface.

In the Embodiment 5 of the present application, the housing 2 is provided with a laser mounting port 201 for mounting the laser 1. Specifically, the laser 1 is sleeved in the laser mounting port 201, with a light emitting direction of the laser 1 facing the cavity of the housing 2. For example, the base 101 is provided with a mounting hole and a stopper hole, via which the laser 1 and the housing 2 are securely connected, thereby fixing the laser 1 within the laser mounting port 201. The inner contour of the laser mounting port 201 is a polygon similar to the outer contour of the laser 1.

For example, in a specific embodiment, the outer contours of the base 101, the substrate 102 and the compound-eye lens 103 are approximately rectangular, and the inner contour of the laser mounting port 201 is approximately rectangular.

A sealing element 3 is sleeved on the laser 1, and is arranged at a position where the laser 1 is fitted to the housing 2. Additionally, the sealing element 3 is press-fitted with the laser 1 and the housing 2, respectively. The sealing element 3 is used to be interference-fitted between the laser 1 and the housing 2 to create a tight fit between the laser 1, the housing 2 and the sealing element 3, so as to seal the laser 1 and the housing 2, preventing dust from infiltrating through the joint between the laser 1 and the housing 2 into the inner cavity of the housing 2, and creating a sealing for the laser projection chamber.

Figure 19:
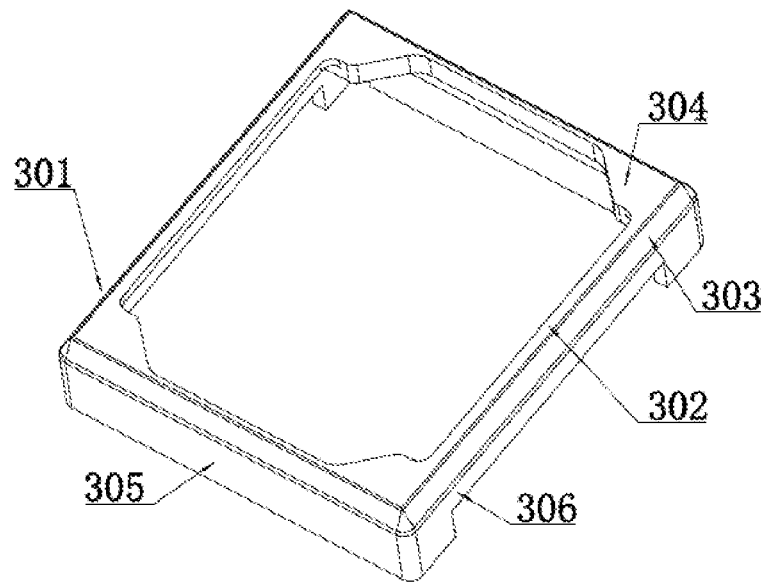
FIG. 19 is a schematic structural view of a sealing element according to Embodiment 5 of the present application.
Figure 20:
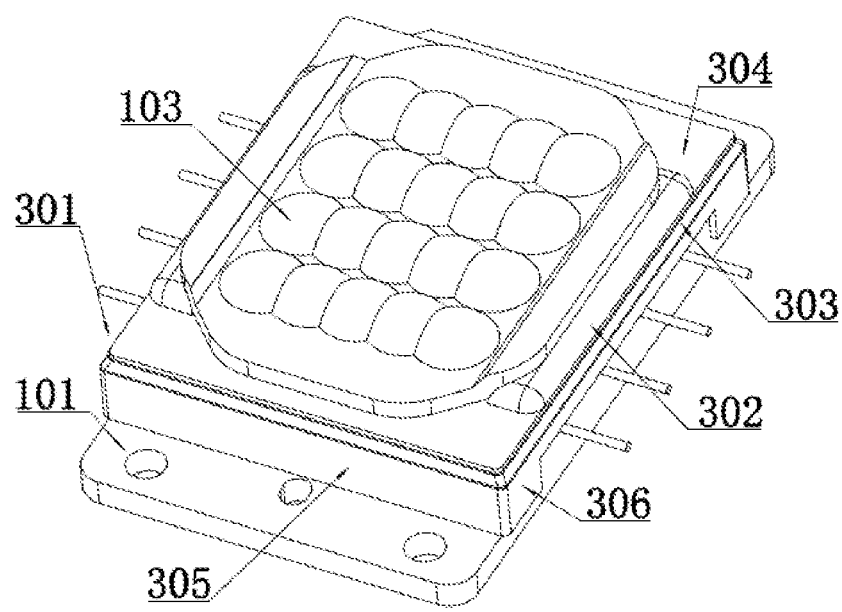
FIG. 20 is an assembled view of a laser and a sealing element according to Embodiment 5 of the present application.
Figure 21:
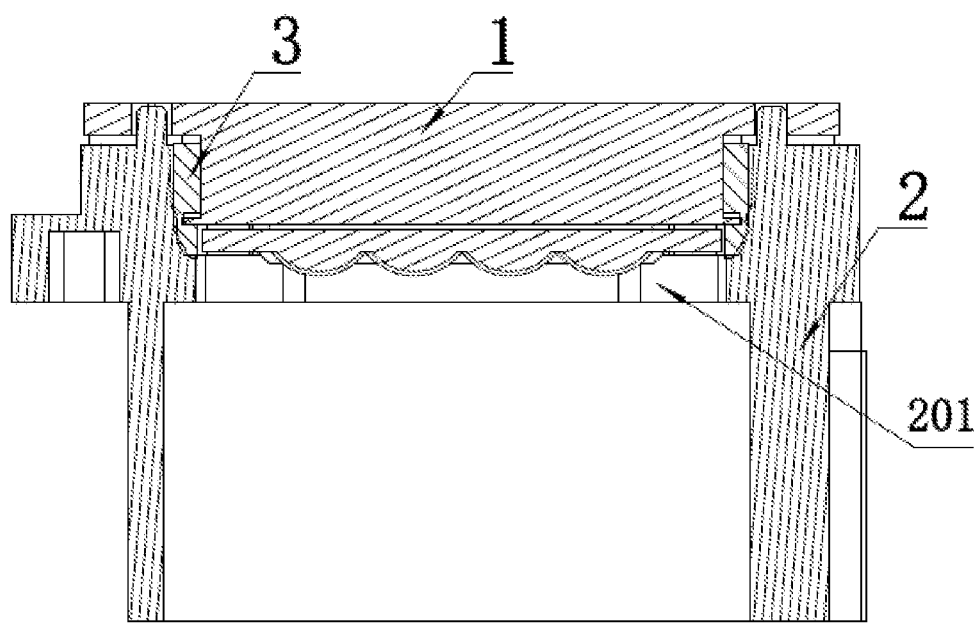
FIG. 21 is a sectional view of a laser light source according to Embodiment 5 of the present application.

FIG. 19 is a schematic structural view of a sealing element 3 according to Embodiment 5 of the present application, FIG. 20 is an assembled view of a laser 1 and a sealing element 3, FIG. 21 is a sectional view of a laser light source according to Embodiment 5 of the present application. As shown in FIG. 19-FIG. 21, the sealing element 3 according to the Embodiment 5 of the present application includes a side part 301 and a top part 302, where the top part 302 is arranged at a top edge of the side part 301. When the laser light source is assembled, the sealing element 3 is interference-fitted within the laser mounting port 201 of the laser 1 and the housing 2. Specifically, the top part 302 covers an edge of the light emitting surface of the substrate 102, the side part 301 wraps around the periphery of the base 101, and the side part 301 is interference-fitted with the laser mounting port 201.

Further, the lateral edges of the top part 302 surround the periphery of the compound-eye lens 103. An inner surface of the side part 301 is press-fitted to the base 101 and a lateral surface of the substrate 102, respectively. An outer surface of the side part 301 is pressed against the lateral surface of the laser mounting port 201. An inner surface of the top part 302 is attached to a top surface of the substrate 102. Thus, in the Embodiment 5 of the present application, the sealing element 3 fully utilizes the uncovered surface of the substrate 102 to improve the sealing effect between the laser 1 and the housing 2.

In a specific assembly process of the laser light source provided in this embodiment, the sealing element 3 is firstly sleeved on the laser 1, with the top part 302 covering the edges of the light emitting surface of the substrate 102, the inner surface of the top part 302 attached to the top surface of the substrate 102, the inner surface of the side part 301 pressed against the base 101 and the lateral surface of the substrate 102, respectively. Then, the laser 1 with the sealing element 3 sleeved on is placed into the laser mounting port 201 of the housing 2, so that the outer surface of the side part 301 is pressed against the lateral surface of the laser mounting port 201, the laser 1 and the housing 2 are fixed, and the sealing element 3 seals the seam between the laser 1 and the housing 2.

In this embodiment, the sealing element 3 may be directly sleeved on the laser 1 to facilitate rapid positioning of the sealing element 3, which helps improving the mounting progress of the sealing element 3 and to ensuring the sealing effect of the sealing element 3 to a certain extent. When the sealing element 3 is fitted to the laser 1, the sealing element 3 is directly sleeved on the side of the light emitting surface of the substrate 102 of the laser 1. Since there is no obstacle, the fitting can be simply accomplished without requiring any auxiliary tool, facilitating the mounting of the sealing element. 3. Compared with the sealing element in prior art, the sealing element 3 provided by the embodiment is more convenient to mount, and the sealing effect may be more easily ensured.

In this embodiment, the sealing element 3 is made from a deformable material when pressed, such as silica gel, rubber or the like. In the embodiment of the present application, a rubber seal is preferred. The rubber seal has, in addition to good elasticity, appropriate level of hardness, which is desirable in providing good resilience in use, effectively avoiding excessive deformation during assembling.

In the laser light source provided by this embodiment, the top part 302 covers the edges of the light emitting surface of the substrate 102 to provide primary sealing, while allowing the laser 1 to provide a supporting force via the top part 302 to the sealing element 3, such as a support from the substrate 102. This is desirable in increasing the support area for the sealing element provided by the laser. Thus, using the substrate 102 of the laser to support the sealing element 3 may effectively prevent the sealing element 3 from being displaced due to the pressing by the housing 2 during assembling, ensuring uniform contact between the sealing element 3 with the laser 1 and the housing 2. The inner surface of the side part 301 is press-fitted to the base 101 and a lateral surface of the substrate 102 respectively, and the outer surface of the side part 301 is pressed against and fitted with the lateral surface of the laser mounting port 201, increasing the contact area between the sealing element 3 and the laser 1, the housing 2. This may, to some extent, increase the friction between the sealing element 3, the laser 1 and the housing 2 during the assembling process to avoid displacement of the sealing element 3, and to further ensure uniform contact between the sealing element 3, the laser 1 and the housing 2. Thus, the sealing element 3 provided by this embodiment may create a good sealing effect between the laser 1 and the housing 2, ensuring the sealing performance between the laser 1 and the housing 2 in the laser light source, preventing dust ingress into the inner cavity of the laser light source, and ensuring the service life of the laser light source.

In this embodiment, the side part 301 of the sealing element 3 needs to ensure an interference amount of 0.1-0.8 mm after the assembling of the sealing element 3 is completed. The interference amount of 0.1-0.8 mm is desirable in ensuring the sealing effect of the sealing element 3 and in facilitating assembling and installation. In a specific embodiment, the sealing element 3 has an interference amount of 0.3 mm after being assembled. Thus, the thickness of the side part 301 may be selected in accordance with the interference amount in conjuncture with the gap size between the laser 1 and the housing 2. For example, when the gap size between the laser 1 and the housing 2 is 2 mm, the thickness of the side part 301 may be selected to be 2.3 mm.

In this embodiment, in order to ensure the top part 302 of the sealing element 3 can offer a good support strength, the thickness of the top part 302 may be 0.5 to 5 mm. Preferably, the top part 302 has a thickness of 2 mm, which is desirable in providing good compression molding, ensuring a support strength and reducing excessive thickness of the top part 302.

Figure 22:
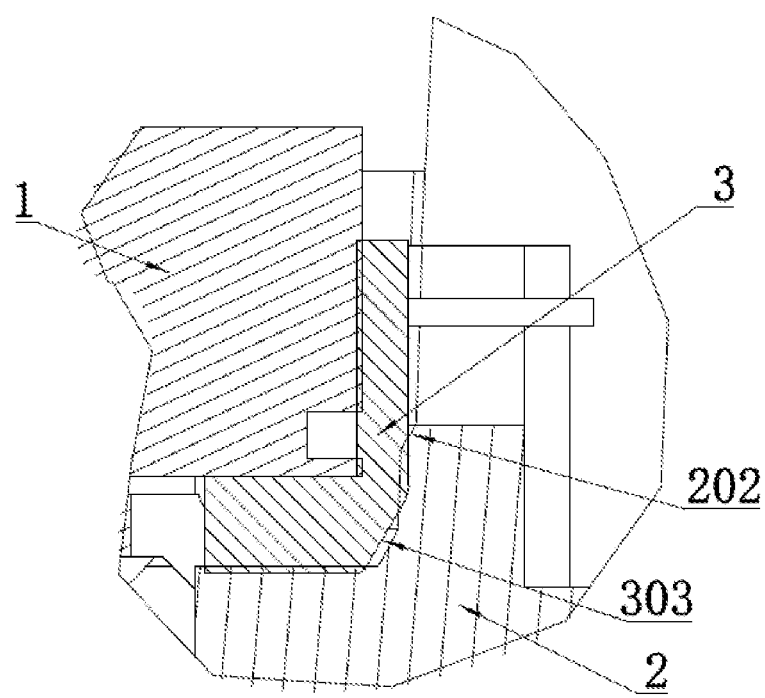
FIG. 22 is a partial enlarged view of a laser light source according to Embodiment 5 of the present application.

Further, in the embodiment of the present application, as shown in FIG. 19, FIG. 20 and FIG. 22, a first guiding slope 303 is arranged at a junction between the top part 302 and the side part 301, where the first guiding slope 303 is inclined along the top part 302 towards the side part 301. When the laser 1 sleeved with the sealing element 3 is assembled with the housing 2, the first guiding slope 303 acts as a guide to help preventing, during assembling, premature deformation of the sealing element 3 under pressure. Therefore, the top part of the sealing element 3 is provided with the first guiding slope 303, which not only facilitates the assembling of the housing 2, but also largely prevents premature deformation of the sealing element 3 under pressure, advantageously ensuring the uniformity in the pressure applied to the sealing element 3.

Further, in this embodiment, as shown in FIG. 22, a top part of the laser mounting port 201 is provided with a second guiding slope 202, which is inclined along a lateral surface of the laser mounting port 201 towards a bottom surface of the housing 2. The second guiding slop 202 helps expanding the dimension of an end part of the laser mounting port 201 to some extent while acting as a guide to facilitate the mounting of the laser. Additionally, premature deformation can be prevented for the sealing element 3 under pressure during assembling.

In a specific embodiment, the laser light source includes the first guiding slop 303 and the second guiding slop 202. When the laser 1 sleeved with the sealing element 3 is assembled with the housing 2, the second guiding slop 202 is first fitted to the first guiding slope 303 to offer double guidance and pre-position for the laser 1 and the housing 2. These further facilitate the assembling of the housing 2, avoid premature deformation of the sealing element 3 under pressure during assembling, and ensure the uniformity in the pressure applied to the sealing element 3.

In this embodiment, the side part 301 of the sealing element 3 may cover the groove on the lateral surface of the laser 1. Additionally, a protuberance may be provided on the inner wall of the side part 301 to fill the groove on the lateral surface of the laser 1. By providing the protuberance to fill the groove on the lateral surface of the laser 1, the sealing element 3 may be positioned during the assembling, which helps improving the sealing performance of the sealing element 3 on the laser 1 and the housing 2.

In this embodiment, the top part 302 of the sealing element 3 includes a reinforcement corner 304 that is located at a corner of the top part 302. In a specific embodiment, the four corners of the substrate 102 on which the compound-eye lens 103 is mounted are left blank, so as to be pressed against the inner surface of the reinforcement corner 304. As shown in FIG. 19, a reinforcement corner 304 is provided at each of the four corners of the top part 302. The reinforcement corners 304 help increasing the support strength of the laser 1 to the sealing element 3, further avoiding displacement of the sealing element 3 during assembling and use, which in turn ensures uniform contact between the sealing element 3, the laser 1 and the housing 2. Additionally, the reinforcement corner 304 is arranged at the corner of the top part 302 to effectively ensure full cooperation between the sealing element 3 and the laser 1.

Further, in a specific embodiment, a pressure corner 203 is provided within the laser mounting port 201. As shown in FIG. 17, the pressure corner 203 is arranged at a corner of the laser mounting port 201, with its top surface pressed against the outer surface of the reinforcement corner 304. That is, the pressure corner 203 is fitted to the reinforcement corner 304. When the laser light source has been assembled, the pressure corner 203 is pressed against the reinforcement corner 304, which offers improved effectiveness in preventing the top part 302 from being squeezed up when the sealing element 3 is deformed under pressure, and preventing the top part 302 from not being attached to the substrate 102, and poor sealing between the laser 1 and the housing 2.

In the embodiment of the present application, the outer contour of the side part 301 of the sealing element 3 is a polygon similar to the outer contour of the laser 1. For example, the outer contour of the sealing element 3 is rectangular, that is, the side part 301 of the sealing element 3 includes two pairs of mutually parallel sidewalls. For convenience of description, the two pairs of mutually parallel sidewalls are referred to as a first pair of sidewalls 305 and a second pair of sidewalls 306, respectively. Typically, the first pair of sidewalls 305 is attached to a width direction of the laser 1, and the second pair of sidewalls 306 are attached to a longitudinal direction of the laser 1.

In the embodiment of the present application, a bottom end of the first pair of sidewalls 305 is in contact with an upper surface of the base 101. When the housing 2 presses the sealing element 3 during assembling, the base 101 may support the sealing element 3 by supporting the first pair of sidewalls 305, which helps preventing the sealing element 3 from being displaced due to the pressing by the housing 2.

As shown in FIG. 18, the laser 1 provided in this embodiment further includes a pin for providing circuitry connection to the laser 1. To prevent the sealing element 3 from interfering with the use of the pin on the laser 1, the second pair of sidewalls 306 are typically lower than the first pair of sidewalls 305. In a specific embodiment, the middle of the second pair of sidewalls 306 is provided with a groove. Two ends of the second pair of sidewalls 306 are aligned with the first pair of sidewalls 305, that is, the middle of the second pair of sidewalls 306 is at a lower height than the two ends of the second pair of sidewalls 306. Thus, the sealing element of this embodiment is more tightly attached to the base 101 of the laser 1 than when the second pair of sidewalls 306 are of the same height. Based on meeting the specific structure of the laser 1, this is also advantageous in ensuring a good sealing effect between the laser 1 and the housing 2.

The laser 1 according to Embodiment 5 of the present application may have a structure, a function and an operation principle similar to the laser 211 according to the Embodiment 1 of the present application, which will not be repeated herein. In addition, the housing 2 of the laser light source provided in this Embodiment 5 has a structure and function similar to the housing 220 in the laser light source 200 according to the Embodiment 1 of the present application, the details of which may be found in the detailed description of the foregoing embodiments, which will not be repeated herein.

The laser light source in the Embodiment 5 may further include a circuit board. The laser 1 is connected to the circuit board, and the laser 1 is turned on by the circuit board, so that the light emitting region of the light emitting surface of the laser 1 may emit a beam. For the shape and structure of the circuit board in this embodiment and the relative positions and connections between the laser and the circuit board, reference may be made to the detailed description of the foregoing embodiments, which will not be repeated herein.

Moreover, the laser 1 may be fixed to the housing 2 by a fixed connection between the circuit board on the periphery of the sidewalls of the laser 1 and the housing 2. For the connections between laser 1, the circuit board and the housing 2, reference may be made to the detailed description of the foregoing embodiments, which will not be repeated herein.

Figure 23:
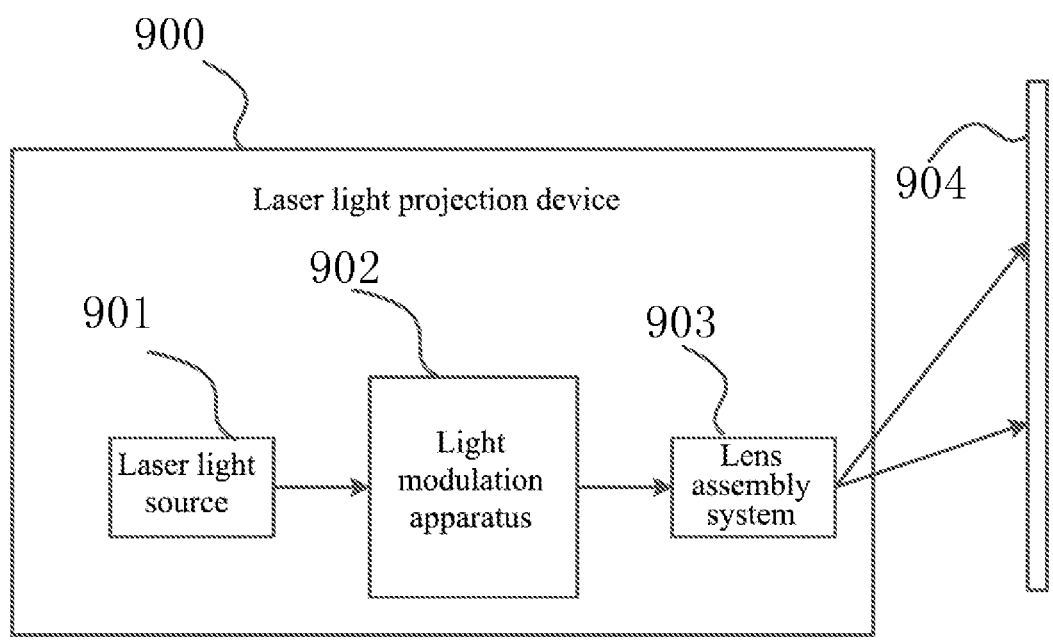
FIG. 23 is a schematic structural view of a laser projection device according to Embodiment 6 of the present application.

Based on the laser light source provided in the Embodiment 5, an embodiment of the present application further provides a laser projection device. FIG. 23 is a schematic structural view of a laser projection device provided in Embodiment 6 of the present application. As shown in FIG. 23, the laser projection device 900 provided in this embodiment includes a laser light source 901, a light modulation apparatus 902, and a lens assembly system 903. The laser light source 901 provides illumination for the light modulation apparatus 902. The light modulation apparatus 902 modulates the beam emitted by the laser light source 901, and outputs the modulated beam to the lens assembly system 903 to create an image that is, in turn, projected to a projection medium 904 to form a projected image. The laser light source 901 is the laser light source according to the Embodiment 5. For the specific structure of the laser light source 901, reference may be made to the detailed description of the Embodiment 5, which will not be repeated herein.

The present application also provides a laser light source and a laser projection device, which may improve heat dissipation efficiency, realize effective control over the temperature of the laser, and achieve the design goal of miniaturization of the laser module. The laser projection device typically includes a light source system, a lighting system and a lens assembly system. A laser in the light source system is used to convert electrical energy into optical energy, which then goes through the lighting system and the lens assembly system to be projected onto a screen, thus projecting a laser image. When the laser converts electrical energy into optical energy, the conversion efficiency is typically around 40%, that is, the remaining 60% of the electrical energy is converted into thermal energy, causing the laser to heat up. As the temperature rises at the laser, the luminous efficiency of the laser tends to drop, so the laser needs to be cooled to ensure the luminous efficiency of the laser.

At present, the housing of the laser is typically provided with a heat sink, and the heat of the laser can be conducted to the heat sink, and the temperature of the laser may be lowered by lowering the temperature of the heat sink. The technology for heat dissipation of heat sink may roughly be categorized into two types, i.e., liquid cooling and air cooling. The liquid cooling technology utilizes the characteristics of large specific heat capacity of the liquid, in which cold liquid carries the temperature of the laser away, the heated up liquid is cooled by a heat dissipation structure, and then circulates back to the heat sink for the next cooling cycle. The air cooling heat dissipation technology typically uses copper blocks to draw heat from the heat sink, and a thermotube with high heat transfer coefficient is used to conduct the heat of the copper block and the heat sink away to a fin module, which is subject to forced convection by a fan for heat dissipation.

However, the current laser projection devices are trending towards miniaturization designs, making the laser smaller and smaller, so is the heat dissipation surface area of the heat sink on the laser. When liquid cooling is used to cool the heat sink, the liquid cooling module occupies a large internal space of the device. Moreover, under the premise of limited heat dissipation surface area of the heat sink, the heat dissipation effect on the laser is poor. In a prior art air cooling technology, the limitation of the space structure causes the inability of a conventional contact between the copper block and the thermotube to meet the heat conduction requirement.

At present, laser projection devices are trending towards miniaturization design, and a design goal is attainable only when the volume of the light source system is small enough. The laser is used as a light emitting component of the light source system. In order to reduce the volume of the laser, a Multi-Chip laser (MCL) is used instead of the conventional Bank laser. The MCL laser replaces traditional bank marchpast arrangement with an integrated semiconductor chip, thereby greatly reducing the space occupied by the laser. The MCL laser has a small volume, leading to a small dissipation surface area of the heat sink thereon, challenging the control of the laser heat dissipation to more stringent requirement.

In order to solve the above problems, Embodiment 7 of the present application provides a laser light source, which includes a laser and a laser heat dissipation assembly for dissipating heat from the laser. The laser heat dissipation assembly operates on heat conduction to dissipate heat from the laser. With a designed contact mode between a heat conduction layer and the thermotubes, the thermotubes are arranged in a laminated way within heat conduction copper blocks. By bending middle portions of the thermotubes to an angle, an optimal joint is achieved between the heat conduction layer and a fin module, maximizing the utilization of the confined structural space to allow the heat of the laser to be quickly conducted to the fin module, ensuring rapid heat transfer from the laser, achieving effective control of the laser temperature, thus achieving the design goal of miniaturizing the laser module.

Figure 24:
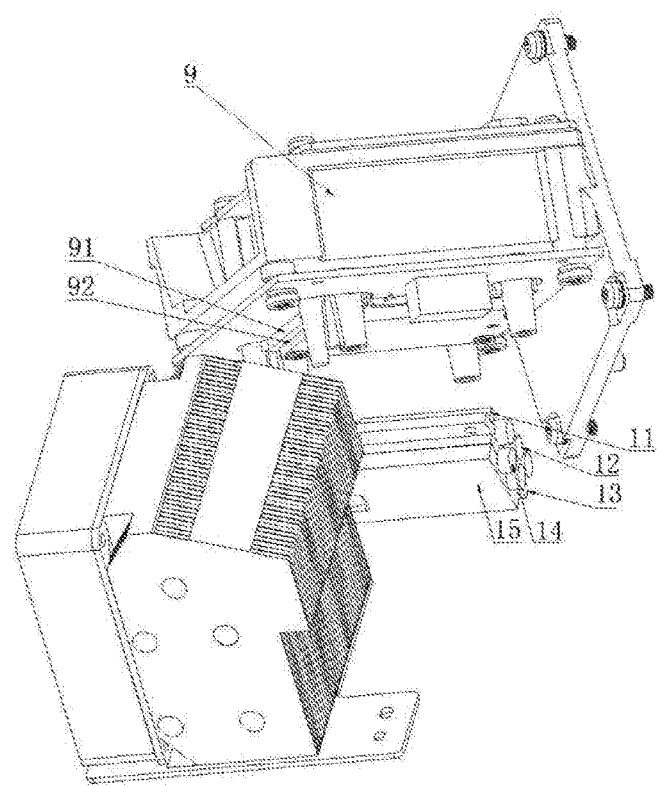
FIG. 24 is a schematic structural view of a laser light source according to Embodiment 7 of the present application.

FIG. 24 is a schematic structural view of a laser light source provided by Embodiment 7 of the present application. As shown in FIG. 24, the laser light source provided in this embodiment includes a laser 91 and a laser heat dissipation assembly for dissipating heat from the laser 91, where the laser 91 is provided with a heat sink 92 on a side facing the laser heat dissipation assembly. The laser heat dissipation assembly includes a heat conduction layer and a fin module 16, and the heat sink 92 is in contact with the heat conduction layer. That is, the heat on the laser 91 is conducted to the heat sink 92 by heat conduction, and the heat on the heat sink 92 is conducted to the heat conduction layer by heat conduction, thereby realizing heat transfer from the laser 91 and lowering the temperature of the laser 91. The laser 91 in the laser light source provided by this embodiment is an MCL laser, and a PCB board of the MCL laser is arranged around the outer surface of the MCL. Therefore, the rear surface of the MCL laser is a more desirable plane for attaching the heat sink 92 directly to the laser 91.

In a specific embodiment, in order to ensure the sealing of the laser light source, a sealing element, such as a sealing ring, may be provided between the heat sink 92 and the laser 91 to prevent external dust from entering the laser 91 through the heat sink 92. Alternatively, the laser 91 may be placed in a sealed housing that is provided with a light entrance port. The laser 91 may be placed in the light entrance port, the heat sink 92 may be embedded in the light entrance port to close up the sealed housing, with the heat sink 92 being in contact with a lateral surface of the laser 91.

Figure 25:
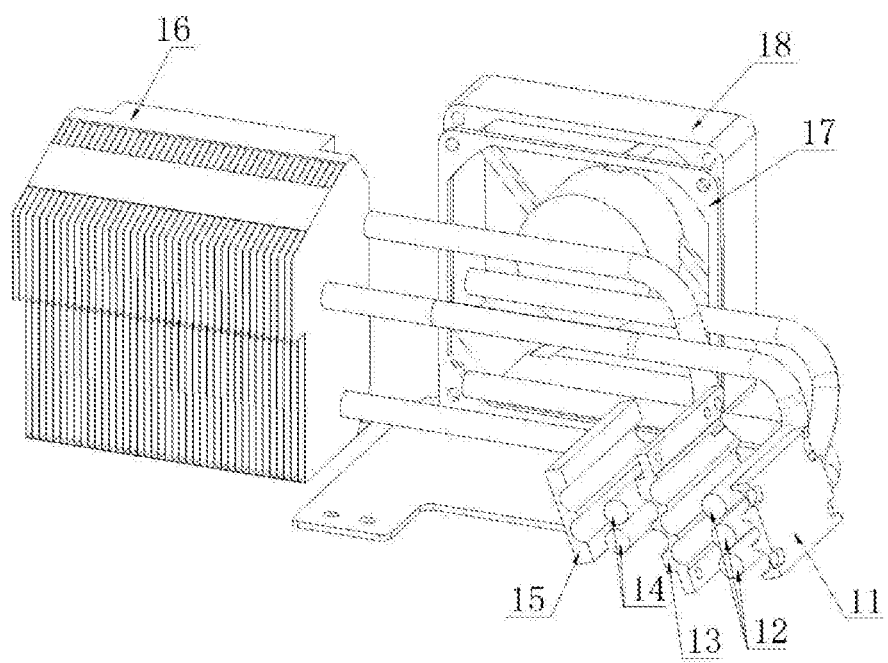
FIG. 25 is a schematic exploded view of a laser heat dissipation assembly in the laser light source according to Embodiment 7 of the present application.

The heat conduction layer includes at least two layers of heat conduction blocks, a plurality of thermotubes are arranged between the adjacent heat conduction blocks, and hot ends of the thermotubes to respectively connected with, the adjacent heat conduction blocks. Specifically, as shown in FIG. 25, the heat conduction layer includes a first heat conduction block 11 and a second heat conduction block 13. The heat sink 92 is in contact with the first heat conduction block 11. A first layer of thermotubes 12 are arranged between the first heat conduction block 11 and a second heat conduction block 13, with the hot ends of the first layer of thermotubes 12 being in contact with the first heat conduction block 11 and the second heat conduction block 13, respectively.

One side of the first heat conduction block 11 is a flat surface that is in contacted with the heat sink 92 via thermal conductive silicone grease. The heat on the laser is conducted away from the heat sink 92 to the first heat conduction block 11 by heat conduction. Specifically, the first heat conduction block 11 is formed by casting way, with C1100, which has a high thermal conductivity, being selected as the manufacturing material. Additionally, one side of the first heat conduction block 11 is locked to the heat sink 92 via four screws, so that the two flat surfaces are tightly attached to improve heat conduction efficiency. The heat sink 92 is position in a compact space, and the first heat conduction block 11 is parallel relative to the heat sink 92, forming an angle of 40°-60° with respect to the horizontal direction, thus saving the horizontal space.

The other side of the first heat conduction block 11 is in contact with the hot ends of the first layer of thermotubes 12, with the heat on the first heat conduction block 11 being conducted to the hot ends of the first layer of thermotubes 12 by heat conduction. The heat transfer coefficient of the thermotubes can be up to $10^4$ order of magnitude, and applies phase change heat transfer of the thermotubes to improve the heat conduction efficiency.

Figure 26:
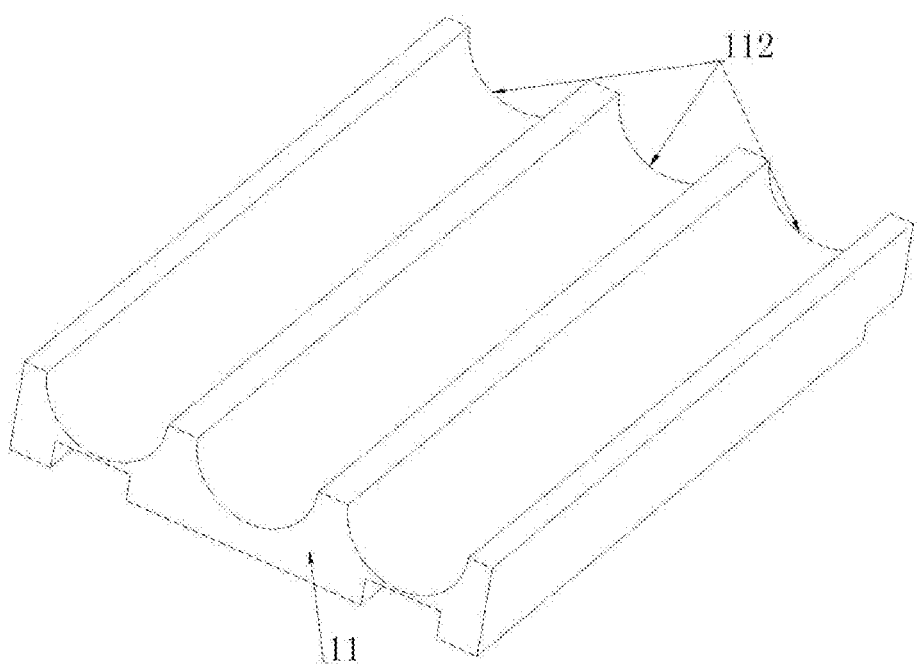
FIG. 26 is a schematic structural view of a first heat conduction block in the laser heat dissipation assembly in the laser light source according to Embodiment 7 of the present application.
Figure 27:
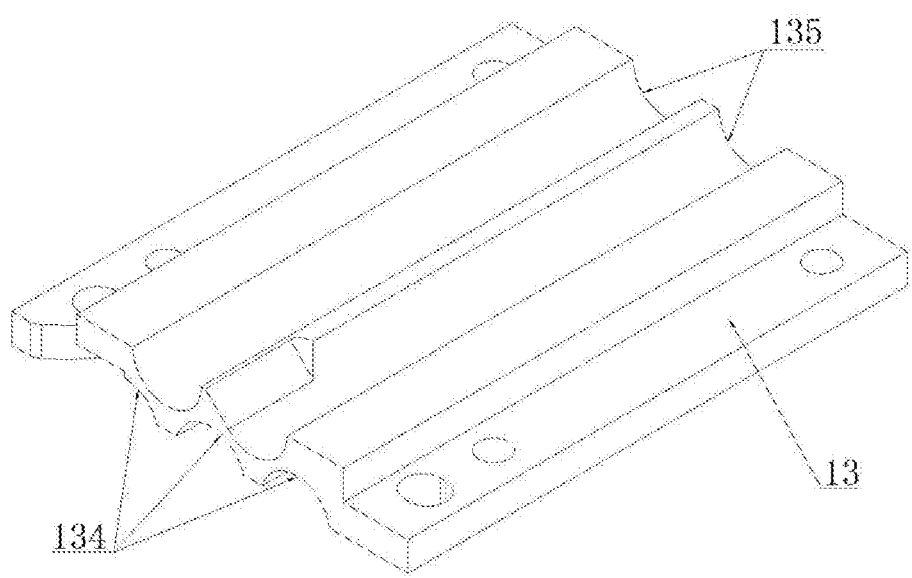
FIG. 27 is a schematic structural view of a second heat conduction block in the laser heat dissipation assembly in the laser light source according to Embodiment 7 of the present application.

Specifically, as shown in FIG. 26 and FIG. 27, a plurality of first grooves 112 are arranged on a side of the first heat conduction block 11 facing the second heat conduction block 13, and second grooves 134 are correspondingly arranged on a side of the second heat conduction block 13 facing the first heat conduction block 11. The first grooves 112 and the second grooves 134 form mounting holes in which the hot ends of the first layer of thermotubes 12 are embedded. Thus, a recessed contact is formed between the first layer of thermotubes 12 and the first heat conduction block 11 and the second heat conduction block 13, increasing the contact surface area between the thermotubes and the heat conduction blocks. In a specific embodiment, there are three first grooves 112 on the first heat conduction block 11.

According to calculations based on heat transfer theory, the heat dissipation capability of the first layer of thermotubes 12 (three thermotubes) is insufficient to meet the requirements of controlling the temperature of the laser. Therefore, a second layer of thermotubes 14 are arranged on the other side of the second heat conduction block 13. Specifically, a side of the second heat conduction block 13 facing away from the first heat conduction block 11 is provided with a plurality of third grooves 135 in which the hot ends of the second layer of thermotubes 14 are embedded. In a specific embodiment, the second grooves 134 and the third grooves 135 are all semi-circular groove structures, so that both layers of thermotubes are in contact with the heat conduction layers via equal path heat conduction. By heat transfer calculation, an optimal distance between the first layer of thermotubes 12 and the second layer of thermotubes 14 is obtained to improve the heat conduction efficiency.

The distance between the semicircular grooves on both sides of the second heat conduction block 13 is equal, forming equal length heat transfer paths that are designed to be between 3 mm and 8 mm. Meanwhile, both sides of the second heat conduction block 13 are processed with through holes for locking screws to fix the second heat conduction block 13.

The fin module 16 includes a plurality of parallel cooling fins. The cold ends of the thermotubes run vertically through the cooling fins, and are uniformly distributed among the cooling fins, achieving uniform temperature distribution among the cooling fins, which is advantageous for heat transfer for the cooling fins. The cold ends of the thermotubes are connected to the cooling fins via soldering, with the thermotubes of the layers of thermotubes distributed evenly within the volume space of the fin module.

The heat dissipation principle of the laser in the laser light source provided in this embodiment may be: the heat generated by the laser 91 is transferred to the heat sink 92 by heat conduction; the heat on the heat sink 92 is conducted to the first heat conduction block 11 by heat conduction; the heat on the first heat conduction block 11 is conducted to the hot ends of the first layer of thermotubes 12 by heat conduction; a part of the heat on the hot ends of the first layer of thermotubes 12 is conducted to the cold ends of the first layer of thermotubes 12, and another part of the heat is conducted to the second heat conduction block 13; the heat on the second heat conduction block 13 is conducted to the hot ends of the second layer of thermotubes 14 by heat conduction; the heat on the hot ends of the second layer of thermotubes 14 is conducted to the cold ends of the second layer of thermotubes 14; the heat on the cold ends of the first layer of thermotubes 12 and the heat on the cold ends of the second layer of thermotubes 14 are conducted to the cooling fins; and the heat is transferred to the air through the cooling fins, thereby lowering the temperature of the laser 91.

In order to improve the heat transfer efficiency of the heat conduction layer, the heat conduction layer may further include a first heat conduction block 11, a second heat conduction block 13 and a third heat conduction block 15. The second layer of thermotubes 14 are arranged between the second heat conduction block 13 and the third heat conduction block 15, with the hot ends of the second layer of thermotubes 14 being in contact with the second heat conduction block 13 and the third heat conduction block 15, respectively. The heat on the second heat conduction block 13 may be conducted to the second layer of thermotubes 14 by heat conduction, and the heat on the second layer of thermotubes 14 can be transferred outwards. Meanwhile, the heat on the second layer of thermotubes 14 may also be conducted by heat conduction to the third heat conduction block 15, so that the heat may be transferred to the air by the third heat conduction block 15. That is, the third heat conduction block 15 may protect and fix the second layer of thermotubes 14 as well as improve the heat conduction efficiency.

Figure 28:
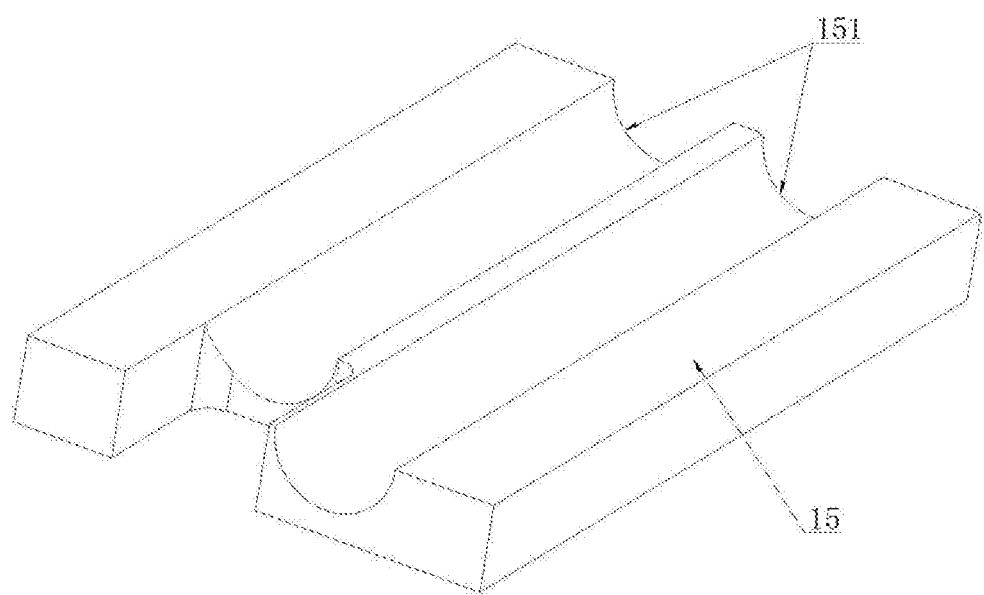
FIG. 28 is a schematic structural view of a third heat conduction block in the laser heat dissipation assembly in the laser light source according to Embodiment 7 of the present application.

Specifically, as shown in FIG. 27 and FIG. 28, a plurality of third grooves 135 are arranged on a side of the second heat conduction block 13 facing away from the first heat conduction block 11, and fourth grooves 151 are correspondingly arranged on a side of the third heat conduction block 15 facing the second heat conduction block 13. The third grooves 135 and the fourth grooves 151 form fixing holes in which the hot ends of the second layer of thermotubes 14 are embedded. The fourth grooves 151 have a semi-circular groove structure capable of increasing the contact area between the second layer of thermotubes 14 and the third heat conduction block 15, protecting and fixing the second layer of thermotubes 14.

In this specific embodiment, the second grooves 134 are spaced apart from the third grooves 135. That is, the positions of the first layer of thermotubes 12 and the second layer of thermotubes 14 are designed in a pyramid manner. The spaced apart layout is adopted to reduce the distance between the first layer of thermotubes 12 and the second layer of thermotubes 14, and to create evenly distributed distances between the thermotubes on both sides, so that the heat transfer distances between the two layers of thermotubes are uniform, which is advantageous for improving the heat conduction efficiency for the heat source.

The heat dissipation principle of the laser in the laser light source provided in this specific implementation may be: the heat generated by the laser 91 is transferred to the heat sink 92 by heat conduction; the heat on the heat sink 92 is conducted to the first heat conduction block 11 by heat conduction; the heat on the first heat conduction block 11 is conducted to the hot ends of the first layer of thermotubes 12 by heat conduction; a part of the heat on the hot ends of the first layer of thermotubes 12 is conducted to the cold ends of the first layer of thermotubes 12, and another part of the heat is conducted to the second heat conduction block 13; the heat on the second heat conduction block 13 is conducted to the hot ends of the second layer of thermotubes 14 by heat conduction; a part of the heat on the hot ends of the second layer of thermotubes 14 is conducted to the cold ends of the second layer of thermotubes 14, and another part of the heat is transferred to the third heat conduction block 15; the heat on the third heat conduction block 15 is transferred to the air; the heat on the cold ends of the first layer of thermotubes 12 and the heat on the cold ends of the second layer of thermotubes 14 are conducted to the cooling fins; and the heat is transferred to the air through the cooling fins, thereby greatly lowering the temperature of the laser 91.

The laminated arrangement of a plurality of rows of thermotubes is adopted in the laser heat dissipation assembly in the laser light source provided in this embodiment. When the surface area of the heat sink 92 is small, the heat transfer area is also small. Thus, if one row of thermotubes includes four tubes (four is the maximum), they will fail to satisfy thermal conductivity requirements. A design including two rows of thermotubes has the following benefits:

a. Two rows of thermotubes may include five to six thermotubes, providing greater heat conductive capabilities than that of a single row of four thermotubes, which can satisfy the thermal conductivity requirements;

b. The design of two rows of thermotubes saves the space in the horizontal direction (a direction horizontal relative to the heat sink 92 plane). Since the laser circuit board, positioning structures, locking structures, etc. are arranged in the horizontal direction, it is necessary to save horizontal space and make more use of the vertical direction space;

c. The traditional way of having the hot ends of one row of thermotubes contacting the fin module is single. With two rows of thermotubes, the hot ends may be distributed in various ways in the fin module, so that the temperature distribution in the fin module is uniform and the heat dissipation efficiency is improved.

In this embodiment, the hot ends of the thermotubes may be respectively fixed among the first heat conduction block 11, the second heat conduction block 13 and the third heat conduction block 15 by tin soldering, thereby reducing the contact thermal resistance between them. Moreover, a distance of 6 mm to 12 mm is maintained between the hot ends, so that the first heat conduction block 11, the second heat conduction block 13 and the third heat conduction block 15 are sufficiently in contact with the hot ends of the thermotubes to improve the heat conduction efficiency.

Figure 29:
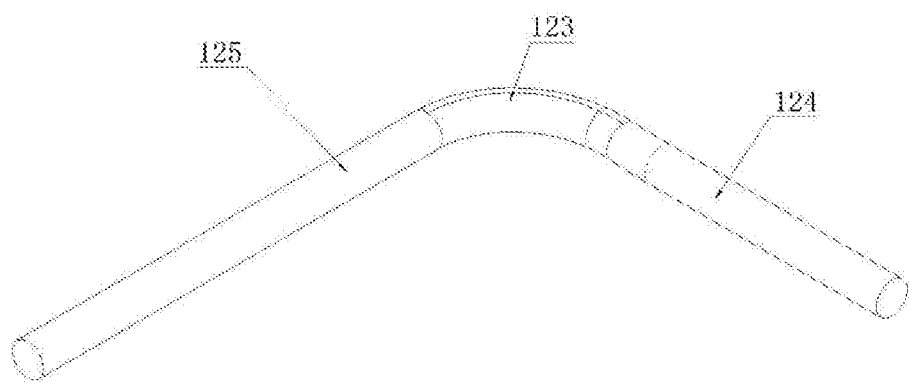
FIG. 29 is a schematic structural view of a thermotube in the laser heat dissipation assembly in the laser light source according to Embodiment 7 of the present application.

After the number of thermotubes between the heat conduction layers is determined, the thermotubes are subjected to a bending process. As shown in FIG. 29, a thermotube includes a hot end 124, a cold end 125, and a bent part 123 connecting the hot end 124 and the cold end 125. The bending is done at a temperature between 150° C.~300° C., and at a bending force between 150N and 250N. By bending a middle portion of the thermotube to an angle, an optimal joint is achieved between the heat conduction layer and the fin module 16, maximizing the utilization of the confined structural space to allow the heat of the laser to be quickly conducted to the fin module 16, thus improving the heat conduction efficiency.

The influence of the bending angle of the thermotubes on the laser temperature can be simulated by thermal simulation software. In an embodiment, the power rating of the laser is set to 100 W, the fan speed is set to 1000 RPM, and the ambient temperature is 25° C. Four angles are defined for bending the thermotubes, which are Angle-1, Angle-2, Angle-3 and Angle-4, e.g., 80°, 90°, 100° and 120°, respectively. Heat transfer by radiation is neglected for the simulation, and the material is set to Cu for the first and second heat conduction blocks. When forming a grid, the level of the metallic heat conduction block and thermotubes is set to 4 level, i.e., the fourth level.

After the parameters are set, the influences of different thermotube bending solutions on the laser Tm are compared. The "Tm" represents a certain position on the laser, which may be, e.g., a heat sink or the center of a heat sink. Thus, the simulation may simulate the influences of different thermotube bending angles on the average temperature of the heat sink or the temperature at the center of the heat sink.

The simulation outcomes are shown in Table 1.

TABLE 1

| Simulation outcome I | | | |
| --- | --- | --- | --- |
| Thermotube bending solution | Ambient Temp. (° C.) | Laser Tm (° C.) | Heat transfer coefficient of thermotube (W/m · k) |
| Angle-1 | 25 | 55.6 | 17800 |
| Angle-2 | 25 | 52.7 | 20500 |
| Angle-3 | 25 | 49.5 | 23300 |
| Angle-4 | 25 | 46.6 | 25600 |

It can be seen from the simulation outcome in Table 1 that different bending angles of the thermotubes may influence the temperature of the laser. Under the premise of satisfying the structural space, selecting the thermotube bending solution Angle-4 for the thermotube heat transfer coefficient is most effective in controlling the temperature of the laser. In a specific embodiment, the bending angle of the bent part 123 is in the range of 80° to 140°.

In this embodiment, the laser heat dissipation assembly further includes a fan bracket 17 and a fan 18 securely mounted on the fan bracket 17. As shown in FIG. 25, the fan bracket 17 is securely mounted on the fin module 16, and the cooling fins are perpendicular to the fan bracket 17. Thus, the cold air is blown by the fan 18 onto the cooling fins to force convection for the cooling fins, promoting heat transfer between the cold ends of the thermotubes and the cooling fins, and quickly transferring heat to the atmosphere space outside the device. The fin module 16 is subjected to a cooling process, forming a circulation system having a temperature difference of 20° C. to 50° C. for the overall heat dissipation system.

The fan 18 forces convection on the fin module 16 to dissipate heat, which may accelerate the temperature reduction for the fin module 16, increase the temperature difference between the cold ends of the thermotubes and the fin module 16, and accelerate the heat transfer between the cold ends of the thermotubes and the fin module. Reduced temperature on the fin module 16 may lower the temperature on the cold ends of the thermotubes, increase the temperature difference between the cold ends and the hot ends of the thermotubes, and accelerate the heat transfer between the cold ends and the hot ends of the thermotubes. Reduced temperature on the cold ends of the thermotubes may lower the temperature on the hot ends of the thermotubes, increase the temperature difference between the heat conduction layer and the thermotubes, and accelerate the heat transfer between the heat conduction layer and the thermotubes. Reduced temperature on the hot ends of the thermotubes may lower the temperature on the heat conduction layer, increase the temperature difference between the heat conduction layer and the heat sink, and accelerate the heat transfer between the heat conduction layer and the heat sink. Reduced temperature on the heat sink may increase the temperature difference between the heat sink and the laser and accelerate the heat transfer between the laser and the heat sink, significantly improving the heat dissipation efficiency for the laser.

In order to prove the advantages of the laser light source provided by the present application in terms of heat dissipation, the influences of the two-row thermotube structure and the single-row thermotube structure on the laser temperature is simulated using thermal simulation software. The details are as the following.

Parameter settings: the two-row thermotube includes N tubes, while the single-row thermotube includes N-2 tubes due to the limited space structure; the power of the laser is set to 100 W, the fan speed is set to 1000, 1600, 2400 and 3000 RPM; the ambient temperature is at 25° C., and heat transfer by radiation is neglected for the simulation. By calculation, the total thermal conductivity of the two-row thermotube is 25000 W/m·k, the thermal conductivity of the single-row thermotube is 18000 W/m·k, and the level of the metallic heat conduction block and thermotubes is set to 4 level.

After the parameters are set, the influences of the two solutions on the laser Tm are simulated, with the outcomes shown in Table 2.

TABLE 2

| | | Simulation outcome II | | | |
|---|---|---|---|---|---|
| Rotate peed (RPM) | Ambient Temp. (° C.) | Laser Tm under two-row thermotube solution (° C.) | Laser Tm under single-row thermotube solution (° C.) | Temperature difference between the two solutions (° C.) | Percentage of temperature change (%) |
| 1000 | 25 | 48.5 | 52.2 | 3.7 | 7.63 |
| 1600 | 25 | 44.4 | 48.5 | 4.1 | 9.23 |
| 2400 | 25 | 37.8 | 42.3 | 4.5 | 11.90 |
| 3000 | 25 | 33.5 | 37.8 | 4.3 | 12.84 |

According to the simulation outcome in Table 2, the laser temperature of the single-row thermotube solution is higher than that of the two-row thermotube solution at the same fan speed and the same ambient temperature, and the mean value of the difference is 4.2° C. At the same ambient temperature, as the fan speed increases, the air volume gradually increases as well, the difference between the two solutions becomes obvious, and the percentage of temperature change increases from 7.63% to 12.84%, indicating that under high air volume, the two-row thermotube solution decreases the laser temperature faster than the single-row thermotube solution.

The laser light source provided by the embodiment of the present application dissipates the heat from the laser through the laser heat dissipation assembly. With a designed contact mode between the heat conduction layer and the thermotubes, the thermotubes are arranged in a laminated way within the heat conduction layer, thereby increasing the number of thermotubes to meet the heat transfer requirement of the laser. By bending a middle portion of the thermotube to an angle, an optimal joint is achieved between the heat conduction layer and the fin module, maximizing the utilization of the confined structural space to allow the heat of the laser to be quickly conducted to the fin module. The fin module includes a plurality of cooling fins, with the cold end of the thermotubes running vertically through the cooling fins, thereby achieving uniform temperature distribution among the cooling fins, which improves the heat dissipation efficiency. The heat is transferred to the outside of the device by forced convection of the fan to ensure the rapid transfer of the heat from the laser, achieving effective control of the laser temperature, thus achieving the design goal of miniaturizing the laser module.

The laser 91 provided in Embodiment 7 of the present application may have a structure, a function and an operation principle similar to the laser 211 according to the Embodiment 1 of the present application, which will not be repeated herein. In addition, the housing of the laser light source provided in this Embodiment 7 has a structure and function similar to the housing 220 in the laser light source 200 according to the Embodiment 1 of the present application, the details of which may be found in the detailed description of the foregoing embodiments, which will not be repeated herein.

The laser light source in the Embodiment 7 may further include a circuit board. The laser 91 is connected to the circuit board, and the laser 91 is turned on by the circuit board, so that the light emitting region of the light emitting surface of the laser 91 may emit a beam. For the shape and structure of the circuit board in this embodiment and the relative positions and connections between the laser and the circuit board, reference may be made to the detailed description of the foregoing embodiments, which will not be repeated herein.

Moreover, the laser 91 may be fixed to the housing by a fixed connection between the circuit board on the periphery of the sidewalls of the laser 91 and the housing. For the connections between laser 91, the circuit board and the housing, reference may be made to the detailed description of the foregoing embodiments, which will not be repeated herein.

Figure 30:
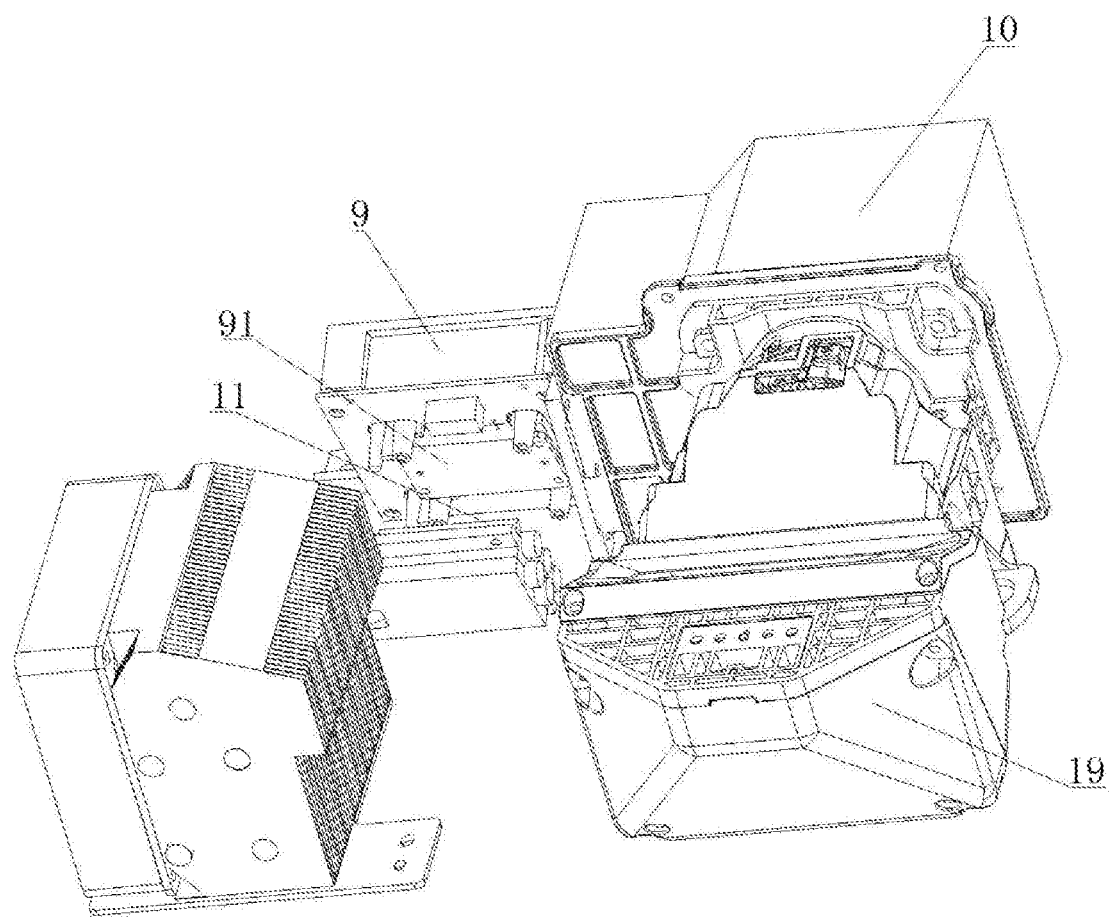
FIG. 30 is a schematic structural view of a laser projection device according to Embodiment 8 of the present application.

Based on the laser light source provided in the above Embodiment 7, an embodiment of the present application further provides a laser projection device. FIG. 30 is a schematic structural view of a laser projection device provided in Embodiment 8 of the present application. As shown in FIG. 30, the device includes a lighting system 10, a lens assembly system 19 and a laser light source 9 provided by the above embodiment. The laser light source 9 supplies a beam to the lighting system 10, the lighting system 10 modulates the beam and outputs it to the lens assembly system 19, and the lens assembly system 19 projects the laser onto a screen.

By means of heat conduction, the heat generated by the laser 91 in the laser light source is conducted to the heat conduction layer of the laser heat dissipation assembly through a heat sink 92, and the heat in the heat conduction layer may be transferred to the outside of the device through heat conduction, thereby realizing effective control over the laser temperature. In addition, the laser light source has a compact structure, a small volume space and a good heat dissipation effect, and can be widely applied to MCL lasers whose heat conduction area is small to meet the miniaturization design of the laser projection device.

In addition, Embodiment 9 of the present application provides a laser projection device, which may include a light source, a lighting system and a lens assembly system, where the light source is the laser light source according to any one of Embodiments 1, 3, 5 and 7. The laser light source provides a beam light to the lighting system, where the lighting system modulates the beam and outputs the same to the lens assembly system to form an image. For the specific structure of the laser light source, reference may be made to the detailed description of the foregoing embodiments, which will not be repeated herein. The laser projection device further includes a diffusion sheet and a light stick, where the diffusion sheet is arranged on the outgoing optical path of the laser light source, and a beam that has been diffused by the diffusion sheet will irradiate on the light stick.

Finally, it should be noted that the foregoing embodiments are merely intended for describing, rather than limiting, the technical solutions of the present disclosure. Although the present disclosure is described in detail with reference to the foregoing embodiments, persons of ordinary skill in the art should understand that they may still make modifications to the technical solutions described in the foregoing embodiments, or make equivalent replacements to some or all technical features therein; however, these modifications or replacements do not make the essence of corresponding technical solutions depart from the scope of the technical solutions in the embodiments of the present disclosure.

What is claimed is:

1. A laser light source, comprising a laser assembly and a housing on which the laser assembly is arranged, wherein the laser assembly comprises a laser and a circuit board, the laser comprises a substrate and a light emitting chip arranged on the substrate, a lateral surface of the substrate is provided with a plurality of pins extending outwards therefrom, the circuit board is arranged on a side where the pins extend, and the circuit board is electrically connected to the pins;

wherein the housing has a laser mounting port, in which the laser is arranged, and the laser further comprises a base which fixes and supports one surface of the substrate, another surface of the substrate is provided with the light emitting chip, and serves as a light emitting surface of the laser, and the laser is securely connected to the housing through the base; and wherein the laser light source further comprises a sealing element, wherein the sealing element comprises a top part and a side part, the top part covers an edge of the light emitting surface of the laser, the side part wraps around a periphery of the base, and the side part is interference-fitted with the laser mounting port.

2. The laser light source according to claim 1, wherein the circuit board has a first surface and a second surface, which are oppositely arranged, and the pins are soldered on the first surface of the circuit board.

3. The laser light source according to claim 1, wherein the light emitting surface of the laser is parallel to the substrate, and the circuit board is parallel to the substrate.

4. The laser light source according to claim 1, wherein the circuit board is provided with a receiving region for receiving the laser, and the laser is arranged in the receiving region.

5. The laser light source according to claim 4, wherein the receiving region is a through hole or an open slot formed in the circuit board.

6. The laser light source according to claim 1, wherein the plurality of the pins are respectively arranged on opposite sides of the substrate.

7. The laser light source according to claim 1, wherein the housing comprises a first bearing part and a second bearing part, the first bearing part being configured to bear the circuit board, and the second bearing part being configured to bear the laser.

8. The laser light source according to claim 1, wherein at least one of the laser and the circuit board is connected to the housing by a fastener.

9. A laser projection device, comprising a laser light source, the laser light source comprising:
a laser assembly, wherein the laser assembly comprises a laser and a circuit board, the laser comprises:
a light emitting chip;
a substrate on which the light emitting chip is arranged, wherein a lateral surface of the substrate is provided with a plurality of pins extending outwards therefrom, the circuit board is arranged on a side where the pins extend, and the circuit board is electrically connected to the pins; and
a base fixing and supporting one surface of the substrate, wherein the light emitting chip is provided on another surface of the substrate, and the another surface of the substrate serves as a light emitting surface of the laser;
a housing on which the laser assembly is arranged, wherein the housing has a laser mounting port in which the laser is arranged, and the laser is securely connected to the housing through the base; and
a sealing element, wherein the sealing element comprises a top part and a side part, the top part covers an edge of the light emitting surface of the laser, the side part wraps around a periphery of the base, and the side part is interference-fitted with the laser mounting port.

10. The laser projection device according to claim 9, wherein the circuit board has a first surface and a second surface, which are oppositely arranged, and the pins are soldered on the first surface of the circuit board.

11. The laser projection device according to claim 9, there are at least two circuit boards, whose positions correspond to the pins.

12. The laser projection device according to claim 9, there is one circuit board, on which a receiving region is provided for receiving the laser, and the laser is arranged in the receiving region.

13. The laser projection device according to claim 12, wherein the receiving region is a through hole or an open slot formed in the circuit board.

14. The laser projection device according to claim 9, wherein the plurality of the pins are respectively arranged on opposite sides of the substrate.

15. The laser projection device according to claim 9, wherein the housing comprises a first bearing part and a second bearing part, the first bearing part being configured to bear the circuit board, and the second bearing part being configured to bear the laser.

16. The laser projection device according to claim 9, wherein at least one of the laser and the circuit board is connected to the housing by a fastener.

* * * * *